(12) United States Patent
Hashmi et al.

(10) Patent No.: US 11,177,440 B2
(45) Date of Patent: Nov. 16, 2021

(54) METHOD FOR INKJET PRINTING AN ORGANIC-INORGANIC PEROVSKITE

(71) Applicants: AALTO UNIVERSITY FOUNDATION, Helsinki (FI); ECOLE POLYTECHNIQUE FEDERALE DE LAUSANNE (EPFL), Lausanne (CH); SOLARONIX S.A., Aubonne (CH)

(72) Inventors: Syed Ghufran Hashmi, Espoo (FI); Merve Ozkan, Helsinki (FI); David Martineau, St-Prex (CH); Xiong Li, Lausanne (CH); Shaik Mohammed Zakeeruddin, Bussigny (CH); Michael Graetzel, Sulpice (CH)

(73) Assignees: AALTO UNIVERSITY FOUNDATION, Helsinki (FI); ECOLE POLYTECHNIQUE FEDERALE DE LAUSANNE (EPFL), Ecublens (CH); SOLARONIX S.A, Aubonne (CH)

( * ) Notice: Subject to any disclaimer, the term of this patent is extended or adjusted under 35 U.S.C. 154(b) by 144 days.

(21) Appl. No.: 16/322,708

(22) PCT Filed: Aug. 2, 2017

(86) PCT No.: PCT/EP2017/069543
§ 371 (c)(1),
(2) Date: Feb. 1, 2019

(87) PCT Pub. No.: WO2018/024777
PCT Pub. Date: Feb. 8, 2018

(65) Prior Publication Data
US 2020/0028081 A1    Jan. 23, 2020

(30) Foreign Application Priority Data
Aug. 2, 2016 (EP) .................................. 16182460

(51) Int. Cl.
H01L 51/42 (2006.01)
H01L 51/00 (2006.01)

(52) U.S. Cl.
CPC ...... H01L 51/0005 (2013.01); H01L 51/4226 (2013.01); Y02E 10/549 (2013.01); Y02P 70/50 (2015.11)

(58) Field of Classification Search
CPC ...... H01L 51/0004–0005; H01L 51/422–4233
See application file for complete search history.

(56) References Cited

U.S. PATENT DOCUMENTS

2015/0243444 A1* 8/2015 Irwin .................... C09D 11/36
136/261

FOREIGN PATENT DOCUMENTS

EP    2966703 A1    1/2016

OTHER PUBLICATIONS

Mei, A., et al., "A hole-conductor-free, fully printable mesoscopic perovskite solar cell with high stability" Science (2014) 345:295-298.

(Continued)

*Primary Examiner* — Daniel P Shook
(74) *Attorney, Agent, or Firm* — Robert C. Netter, Jr.; Dann, Dorfman, Herrell & Skillman

(57) ABSTRACT

The present invention provides a method for depositing an organic-inorganic perovskite, the method comprising the step of depositing a perovskite precursor solution comprising one or more organic cation, wherein said precursor solution preferably deposited by inkjet printing. The method is particularly useful in the manufacture of perovskite solar cells. For depositing the perovskite, a perovskite precursor solution or ink is preferably used, which comprises an organic cation carrying an anchoring group, such as 5-ammonium valeric acid. Surprisingly, the presence of the latter (Continued)

compound renders the precursor solutions stable and suitable for inkjet printing.

18 Claims, 8 Drawing Sheets

(56) References Cited

OTHER PUBLICATIONS

Li, S-G, et al., "Inkjet printing of CH3NH3PbI3 on mesoscopic TiO2 film for highly efficient perovskite solar cells" J. Materials Chem. A (2015) 3:9092.

* cited by examiner

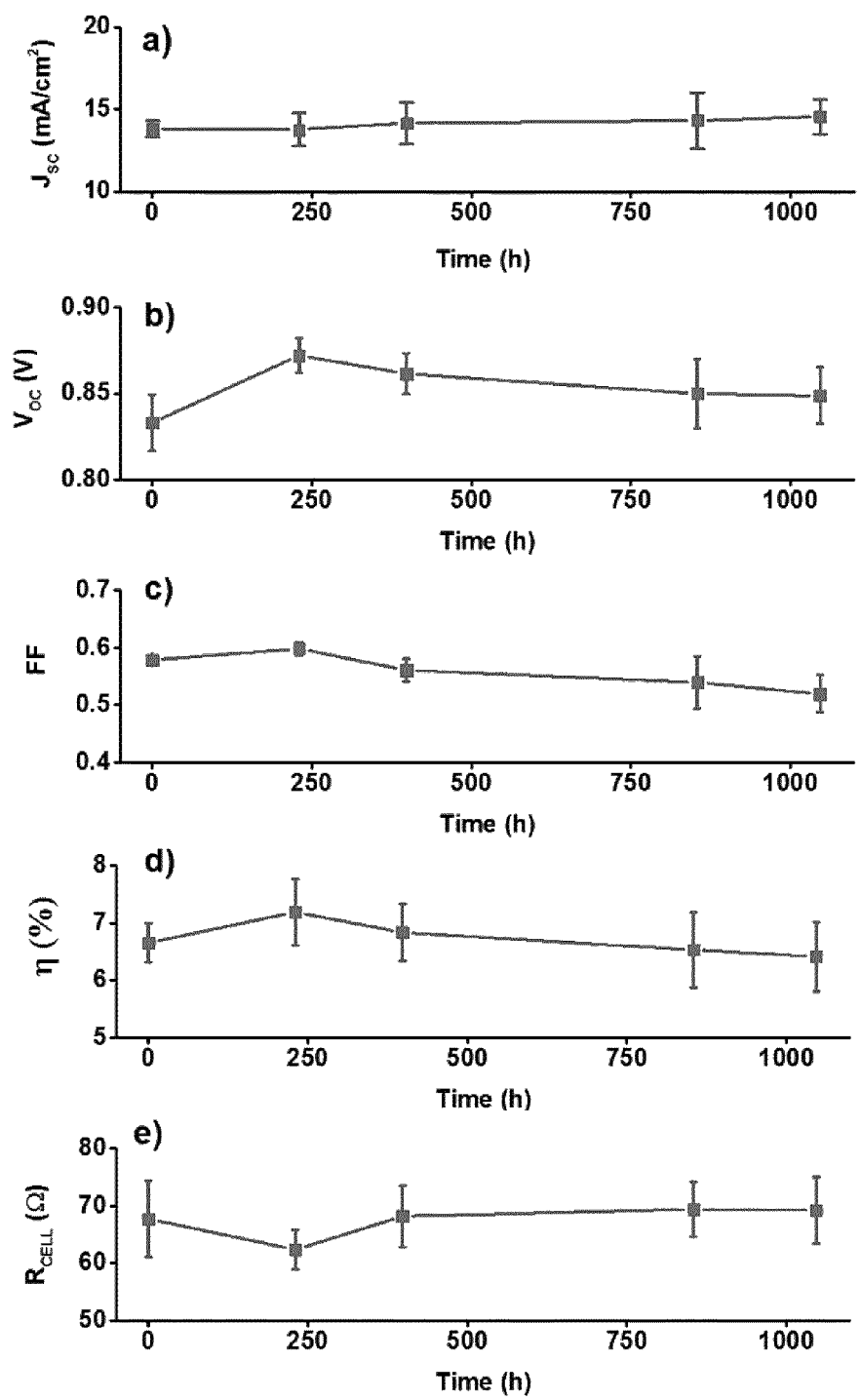
Figures 6 a)-e)

METHOD FOR INKJET PRINTING AN ORGANIC-INORGANIC PEROVSKITE

This application is a § 371 application of PCT/EP2017/069543, filed Aug. 2, 2017, which claims priority to European Patent Application No. 16182460.2, filed Aug. 2, 2016. The entire disclosure of each of the foregoing applications is incorporated by reference herein.

TECHNICAL FIELD

The present invention relates to a method for depositing at least part of an organic-inorganic perovskite, a method for producing a perovskite solar cell and perovskite solar cells obtainable by the method of the invention.

PRIOR ART AND THE PROBLEM UNDERLYING THE INVENTION

Perovskite solar cells (PSCs) have stunned the photovoltaic community with an incredible progress in recent years while showing conversion efficiencies more than 22%. Like dye sensitized solar cells (DSSCs), these solution processed photovoltaic systems could also be fabricated via mass reproducible printing schemes, which may further reduce their overall production cost. However, the traditional PSCs configurations have not been found stable and exhibited poor stability in long term aging tests. Alternative strategies, for instance, introducing $Al_2O_3$ either as buffer layer to prevent ion migration from metal electrode, replacing mesoporous $TiO_2$ with $Al_2O_3$ to suppress the UV instability of the devices, or selecting some other alternative materials and cells structures have been adopted to address the aforesaid challenges which have shown notable performance along with improved stability. Among different configurations of PSCs, the hole transporting material (HTM) free carbon counter electrode based printable mesoscopic perovskite solar cells have drawn significant attention due to promising characteristics e.g. abundant availability of incorporated materials, i.e. $TiO_2$, $ZrO_2$ and carbon nanoparticles, elimination of costly HTM (e.g. Spiro-OMeTAD) and high stability. Although claimed as fully printable mesoscopic perovskite solar cell in earlier reports, the two steps of fabrication (i.e. spray pyrolysis and manual infiltration of perovskite precursor solution) for carbon based PSCs cannot be realized as 'printing steps' and may also generate performance variations in the fabricated devices. Nevertheless, the importance of this configuration is that it's up-scaling is possible if the manual infiltration of perovskite precursor step, which has been used in all previous studies, could be replaced with mass reproducible technique then the whole device may be potentially produced on large area for practical deployment.

CN203871350 claims a method for printing a perovskite thin film solar cells by way of ink-jet printing. According to this document, all layers of the cell, including a dense $TiO_2$ layer, a mesoscopic $TiO_2$ layer and a perovskite layer were to be deposited by inkjet printing. There are other references that claim the production of a perovskite solar cell entirely by printing technologies.

However, after almost 5-7 years of progress in PSCs research, the reports on inkjet printing of the perovskite precursor inks are a few (references 25-27) due to limitations such as the rapid transformation of perovskite crystals from the liquid precursors on surfaces due to which the nozzles of the printing cartridges experience clogging and do not remain operational for precise materials deposition.

The article Shao-Gang Li et al., Inkjet printing of $CH_3NH_3PbI_3$ on a mesoscopic $TiO_2$ film for highly efficient perovskite solar cells, J. Mater. Chem. A, 2015, 3, 9092 is about inkjet printing of perovskites in perovskite solar cells. The publication is principally concerned with the heating of the platen on which the solar cell is positioned inside the printer. The authors find that a temperature of 50° C. is advantageous for accelerating solvent evaporation after printing of the perovskite precursor ink. The inks used in this article are not stable at RT, leading to precipitation of solids within 20 minutes, or not dissolving at all. The authors are silent with respect to how solutes were dissolved and about the temperature of the ink in the cartridge. Furthermore, this reference does not anticipate the printing of larger surfaces and thus large solar cells.

US2015/0242444 discloses photovoltaic perovskite devices comprising optional additives. Several perovskite deposition methods are mentioned in this reference. The reference focuses on the presence of an interfacial layer for enhancing charge transport and preventing charge recombination. In summary, this reference is substantially concerned with perovskite solar cell architectures allowing maximizing the power conversion efficiency.

EP2966703 discloses organic inorganic perovskite heterojunction photovoltaic devices wherein 5-amoniumvaleric acid iodide is used as a templating agent for enhancing crystal growth of the perovskite, device performance and stability.

The perovskite precursor solutions that have been proposed previously all have the drawback that said solutions, when getting in contact with a surface, for example of a glass vial or printing cartridge, rapidly precipitate, such that said solution cannot be applied by way of printing techniques.

For the purpose of the present invention, enhanced crystal growth of the perovskite is a disadvantage if crystal growth and thus precipitation occurs too early, in particular in the printing cartridge, at the printing nozzle, or indeed at any moment before complete infiltration of a porous surface increasing layer or a porous photoanode.

Indeed, there is currently no stable precursor ink as essentially required to produce precise infiltration and printing of perovskite absorbing layer while not damaging the print head of the printer cartridge. The case is more critical for carbon counter electrode based triple layer PSCs configuration in which the perovskite precursor ink needs to be infiltrated from the top of the thick porous carbon and has to go through a porous $ZrO_2$ layer before filling the pores of a mesoporous $TiO_2$ layer with the crystals of perovskite.

The present invention aims at providing a method for depositing an organic-inorganic perovskite by printing technology, in particular by inkjet printing.

It is an objective of the invention to provide an ink suitable to produce a perovskite while having the properties required to enable printing of the perovskite.

It is an objective of the invention to enable provide a method that allows the production of a solar cell entirely by scalable technologies, in particular the steps including the deposition of a dense semiconductor layer, a mesoporous semiconductor layer, possibly an insulating layer, a counter electrode, and in particular the perovskite light harvester. It is an objective of the invention to enable the printing of a perovskite layer, in particular by inkjet printing.

It is an objective of the invention to render the production of perovskite solar cells amenable to up-scaling and/or industrial production.

It is also an objective to provide a reliable, precise and/or reproducible method for depositing a perovskite, in particular a precise amount of perovskite over a particular surface.

It is an objective of the invention to provide a method that allows producing perovskite solar cells that have high stability and high conversion efficiency, thereby producing solar cells that are overall competitive.

The present invention addresses the problems depicted above and further problems as become apparent from the disclosure below.

SUMMARY OF THE INVENTION

Remarkably, the present inventors provide a perovskite precursor ink that exhibits high stability at room temperature (25° C.) and that makes it possible to deposit organic-inorganic perovskite with high precision, high reproducibility and obtaining solar cells having surprising performance and stability.

In an aspect, the present invention provides method for depositing at least part of perovskite, the method comprising the step of depositing a perovskite precursor solution comprising a compound suitable to slowing down the precipitation and/or crystal growth of said perovskite.

In an aspect, the invention provides a method for depositing at least part of an organic-inorganic perovskite, the method comprising the step of depositing a perovskite precursor solution comprising one or more organic cation, wherein said precursor solution is deposited by depositing the ink through a printing nozzle. In an embodiment, said precursor solution is deposited by inkjet printing.

In an aspect, the invention provides the use of a compound for slowing down the nucleation and/or crystallization process of a perovskite in a perovskite precursor solution. In an aspect, the invention provides the use of a compound for reducing and/or slowing down nucleation and/or precipitation of perovskite or perovskite intermediates in an inkjet ink comprising an organic-inorganic perovskite precursor solution.

In an aspect, the invention provides a method for producing one or more selected from the group of: a solar cell, part of a solar cell, and a subassembly of a solar cell, the solar cell comprising a light harvester that is an organic-inorganic perovskite, wherein said method comprises the step of depositing said perovskite precursor solution in accordance with the invention.

In an aspect, the invention provides a method for producing one or more selected from the group of: a solar cell, part of a solar cell and a subassembly of a solar cell, the method comprising the step of depositing said perovskite precursor solution in accordance with the invention.

In an aspect, the invention provides a method for producing a solar cell comprising a plurality of layers, wherein one or more of said layers are deposited by printing techniques or other scalable techniques, and wherein at least part of the light harvester of said solar cell is deposited by way of the method of the invention.

In an aspect, the present invention provides a printing ink comprising a perovskite precursor solution.

In an aspect, the present invention provides a perovskite and/or a perovskite layer obtained in accordance with the present invention.

In an aspect, the present invention provides a printed organic-inorganic perovskite.

In an aspect, the present invention provides a solar cell comprising a perovskite obtained in accordance with the invention.

In an aspect, the present invention provides the use of a cation of formula (I) for producing a printable ink solution.

In an aspect, the present invention provides the use of a cation of formula (I) for reducing and/or slowing down one or more selected from the nucleation, crystal growth and/or precipitation in a perovskite precursor solution.

In an aspect, the present invention provides the use of a cation of formula (I) for increasing the stability of a perovskite precursor solution and/or rendering such solution amenable to printing, for example inkjet printing.

In an aspect, the present invention provides an ink suitable for depositing a perovskite by printing, said ink comprising a cation of formula (I).

Further aspects and preferred embodiments of the invention are defined herein below and in the appended claims. Further features and advantages of the invention will become apparent to the skilled person from the description of the preferred embodiments given below.

BRIEF DESCRIPTION OF THE DRAWINGS

FIG. 6 shows the results of a one sub soaking test at 35° C. of a batch of nine perovskite solar cells produced in accordance with an embodiment of the invention.

DETAILED DESCRIPTION OF THE PREFERRED EMBODIMENTS

Figure 1:
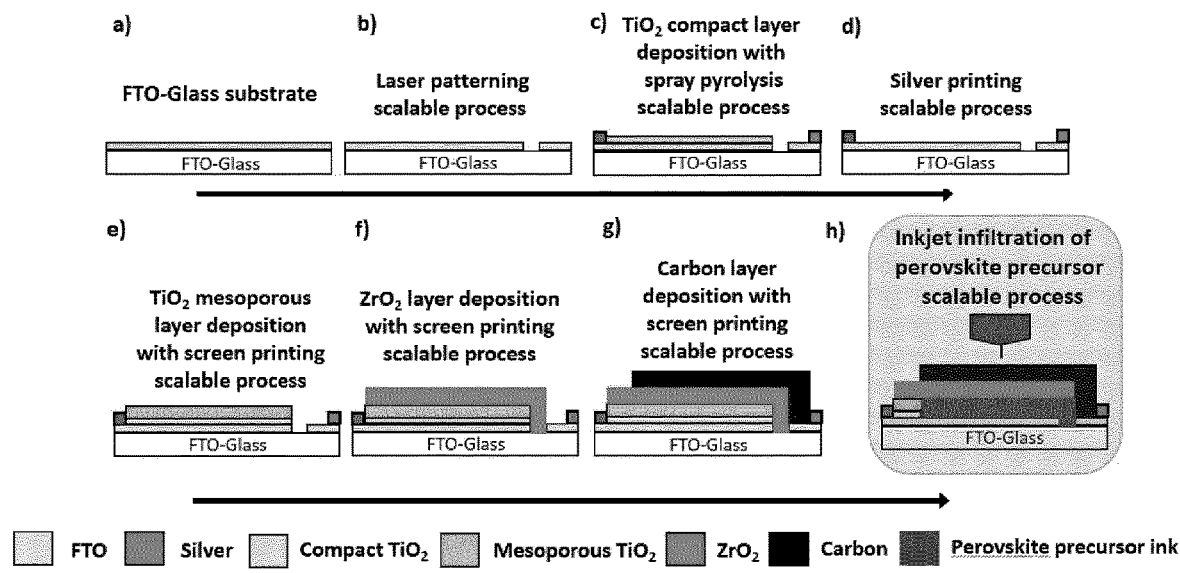
FIG. 1 is an illustration of the scalable process to be employed for the production of HTM free carbon based perovskite solar cells in accordance with an embodiment of the invention. a) FTO coated glass b) laser patterning of the FTO layer c) spray pyrolysis of compact $TiO_2$ layer d) screen printing of silver contacts e) screen-printing of a mesoporous $TiO_2$ layer f) screen-printing of an insulating $ZrO_2$ layer g) screen-printing of a porous carbon composite layer h) inkjet of a controlled volume of perovskite precursor solution, which is targeted in this work. Note: Only scalable processes are highlighted here. The sintering steps consecutive to screen-printing are not represented for better clarity.

The present invention provides a printing ink comprising a perovskite precursor solution and a method for depositing a perovskite. The invention also relates to perovskite precursor solutions that are substantially stable, for example at room temperature (25C°).

The present invention makes it possible to deposit perovskites by printing techniques, such as inkjet printing.

In a preferred embodiment, said perovskite is an organic-inorganic perovskite, composed of one or more organic cations, one or more inorganic cations, and two or more anions, providing a perovskite material that is preferably overall neutral. The components of the perovskite will be discussed in more detail elsewhere in this specification. Preferably, the precursor solution further comprises a solvent for dissolving the components of the perovskite.

In an embodiment of the invention, the perovskite precursor solution is also an ink solution, as it can be deposited by printing techniques.

In a preferred embodiment of the invention, the perovskite precursor solution comprises all components required to form said perovskite. Preferably, said precursor solution or ink, when deposited, results in the formation of perovskite crystals forming said perovskite.

The person skilled in the art would expect, from the fact that said precursor solution comprises all components required to form said perovskite, that the precursor solution is not stable, because of the formation of crystals and/or precipitates during storage of the solution. Surprisingly, the precursor solution of the invention is preferably sufficiently stable to allow for printing.

In a preferred embodiment, the perovskite precursor solution comprises a compound or component that is suitable to inhibit, slow down, reduce and/or prevent one or more selected from: nucleation rate, crystal growth and precipitation of perovskite, perovskite crystals and/or a perovskite intermediate phase. Said compound may be referred to as "precipitation retarding compound" or more shortly "retarding compound". This compound may be any compound suitable to prevent or slow down precipitation of perovskite or perovskite intermediates in the precursor solution, while enabling and/or not preventing such precipitation upon deposition of the precursor solution. In an embodiment, the compound may allow crystallization and/or precipitation upon an additional process step, for example following heating. In an embodiment, the method of the invention comprises heating the deposited perovskite precursor solution, so as to as remove solvent and/or initiate and/or accelerate one or more selected from precipitation and perovskite crystal growth.

The "precipitation retarding compound" may be part of the perovskite to be formed or may not be part of the perovskite to be formed. In some embodiments, the "precipitation retarding compound" is preferably associated with or comprised in said organic inorganic perovskite.

In an embodiment, said perovskite precursor solution is stable when stored for 1 day or more at room temperature (RT, 25° C.) in a glass vial and/or printer cartridge, wherein stable refers to the absence of crystal growth and/or precipitation of solutes during said 1 day (24 hours). In another embodiment, the perovskite precursor solution is stable for at least 12 hours following preparation. Preferably, however, said perovskite precursor solution is stable when stored for 2 days or more, more preferably for 5 days, even more preferably 1 week, and most preferably 2 weeks or more, at RT. In some embodiments, the perovskite precursor solution is stable for up to 3 months and possibly more. Storing may take place in a glass or suitable plastic recipient. A printer cartridge is generally made from plastic material, and the precursor solution is preferably stable for the indicated time in a printer cartridge.

Precipitates resulting from said precipitation are preferably visible by eye, such that absence of precipitation refers to absence of precipitation that can be recognized by the eye, and in particular absence of precipitation that would result in clogging of the printer nozzle.

In an embodiment, the "precipitation retarding compound" is an organic or an organometallic compound and/or preferably comprises one or more carbon atoms.

In an embodiment, the "precipitation retarding compound" comprises an anchoring group, suitable to anchor the compound to the surface of a metal oxide material. Preferably, the anchoring is represented by the letter "A" as defined elsewhere in this specification. Indeed, in a preferred embodiment, the present invention relates to perovskite solar cells comprising metal oxide materials, for example metal oxide semiconductor materials suitable to transport electrons that have been photo-exited in the perovskite. Preferably, the perovskite is deposited such that it gets in contact with said metal oxide semiconductor.

Anchoring groups (A) may be selected from the group consisting of: —COOH, —$CONH_2$, —$PO_3H_2$, —$PO_2H_2R^2$, —$PO_4H_2$, —$SO_3H_2$, —CONHOH, combinations thereof, salts thereof, deprotonated forms thereof, and other derivatives thereof, for example. $R^2$ may be selected from organic substituent comprising from 1-20 carbon atoms and 0-10 heteroatoms, preferably from 1-10 carbon atoms and 0-8 heteroatoms, 1-5 carbon atoms and 0-3 heteroatoms, for example. In an embodiment, said $R^2$ also carries an anchoring group. Alternatively, $R^2$ is a hydrocarbon. In an embodiment, $R^2$ also is totally or partially halogenated, independently of said heteroatoms. Preferably, said heteroatoms are selected from O, S, Se, Te, N, B, P, for example.

In an embodiment, the "precipitation retarding compound" comprises a positively charged group. In an embodiment, said positively charged group may be any stable, positively charged group of an organic or organometallic compound.

In an embodiment, the "precipitation retarding compound" comprises a group comprising a nitrogen atom, preferably a nitrogen atom present in a positively charged state. Preferably, the nitrogen containing group is represented by the letter "W", for example as defined elsewhere in this specification. Exemplary groups may be selected from $—NH_3^+$, $—NH—C(NH_3^+)=NH$, and $—N=CH—NH_3^+$. The compound preferably comprises an ammonium group.

In an embodiment, said "precipitation retarding compound" comprises a linker or spaceholder moiety ($R^1$), connecting said anchoring group and said preferably positively charged group, for example said positively charged nitrogen atom.

In an embodiment, said linker moiety is preferably an organic moiety comprising 1-20 carbons and 0-10 heteroatoms, preferably 2-12 carbons and 0-7 heteroatoms, more preferably 3-10 carbons and 0-5 heteroatoms, and most preferably 4-8 carbons and 0 heteroatoms. Said organic moiety may be totally or partially halogenated, in addition to said heteroatoms.

In an embodiment, said linker moiety is preferably a C1-C20 hydrocarbon, preferably a C2-C15 hydrocarbon, more preferably a C3-C12 hydrocarbon, and most preferably a C4-C8 hydrocarbon.

In an embodiment, said linker moiety is preferably selected from the group consisting of a C1-C20 alkanediyl, C2-C20 alkynediyl, C2-C20 alkynediyl, C4-C20 heteroaryldiyl, and C6-C20 aryldiyl, preferably C2-C15 alkanediyl, C2-C15 alkynediyl, C2-C15 alkynediyl, C4-C15 heteroaryldiyl, and C6-C15 aryldiyl, more preferably C3-C12 alkanediyl, C3-C12 alkynediyl, C3-C20 alkynediyl, C4-C12 heteroaryldiyl, and C6-C12 aryldiyl, most preferably C4-C8 alkanediyl, C4-C8 alkynediyl, C4-C8 alkynediyl, C4-C8 heteroaryldiyl, and C6-C8 aryldiyl.

In an embodiment, said linker moiety is preferably $—(CH_2)—_n$, with n being an integer of 1-20, preferably 2-15, more preferably 3-12 and most preferably 4-8, for example 2-7.

In an embodiment, said "precipitation retarding compound" is a cation of formula (I):

$$A\text{-}R^1\text{—}W^+ \quad (I),$$

wherein A is said anchoring group as defined in this specification, $R^1$ is said linker or spaceholder moiety, and $W^+$ is said positively charged group. A, $R^1$ and $W^+$ are preferably as defined above.

In a preferred embodiment, A is selected from $—COOH$, $—CONH_2$, $—PO_3H_2$, $—PO_2H_2R^2$, $—PO_4H_2$, $—SO_3H_2$, $—CONHOH$, and salts thereof, $R^2$ is an organic substituent comprising from 1-20 carbon atoms and 0-10 heteroatoms, W is a positively charged moiety comprising a positively charged nitrogen atom; $R^1$ is an optionally substituted organic moiety comprising 1-20 carbons and 0-10 heteroatoms, wherein $R^1$ and $R^2$ may be, independently, totally or partially halogenated.

In an embodiment, said positively charged nitrogen atom is selected from the group consisting of: $—NH_3^+$, $—NH—C(NH_3^+)=NH$, and $—N=CH—NH_3^+$.

In an embodiment, $R^2$ is as defined elsewhere in this specification. Preferably, $R^2$ is $—(CH_2)—_n$, with n being an integer of 1-10, preferably 2-8, most preferably 3-7.

In an embodiment, said "precipitation retarding compound" is a cation selected from the cations of formulae (1)-(3):

(1)

(2)

(3)

and salts of said cations (1)-(3),
wherein n is an integer of 1-10, preferably 2-7, most preferably 3-6.

In an embodiment, said "precipitation retarding compound" is an organic cation that is added to or present in said precursor solution in the form of a salt comprising at least one anion. In an embodiment, said anion is independently selected from the group consisting of: halide anions, $CN^-$, $NCO^-$, $NCS^-$, $NCSe^-$ and $BF_4^-$. Preferred halides are $I^-$, $Cl^-$, $Br^-$ and $F^-$.

In an embodiment, said "precipitation retarding compound" is selected from ammonium carboxylic acid halides with variable alkyl chains or moieties, for example separating the ammonium from the carboxylic acid group. For example, the alkyl chain may be as n defined with respect to formulae (1)-(3).

In an embodiment, the "precipitation retarding compound" is selected from 5-ammonium valeric acid (5-AVA), 5-aminopentanamide (5-APAC), 4-aminobutylphosphonic acid (4-ABPAC).

In some embodiments, said "precipitation retarding compound" is selected from an amino acid, an amino acid hydrohalide, a formamidinium halide, and an imidazolium halide.

In an embodiment, the perovskite precursor solution comprises components in addition to said "precipitation retarding compound". In the event that the retarding compound is added in the form of a cation, this cation may also be referred to as a first organic cation. As indicated, the perovskite precursor solution preferably comprises at least a further or second organic cation, which is required for perovskite formation. Preferably, said second organic cation is comprised in said organic inorganic perovskite and/or said first organic cation is preferably associated with or comprised in said organic inorganic perovskite.

It is noted that said "second organic cation" may and preferably is present in higher amounts compared to said "first organic cation". Preferably, the "second organic cation" is present in higher amounts and thus preferably a more important constituent of the organic-inorganic perovskite to be deposited. Without wishing to be bound by theory, the inventors believe that the "first organic cation", on the other hand, may be located at the interfaces between the perovskite and other materials, for example with the n-type semiconductor or possibly said porous insulating or spaceholder layer as described elsewhere in this specification.

In the event that the "precipitation retarding compound" is not added in the form of a cation in said precursor solution, but as an uncharged molecule or as an anion, said "second organic cation" may be considered to be the only and thus first organic cation.

Organic cations that can be used for the preparation or organic-inorganic perovskites have been reported previously. In an embodiment, said second organic cation is a cation selected from the compounds disclosed in the international application PCT/IB2015/055025, filed on Jul. 3, 2015, and published on Jan. 14, 2016, with publication number WO2016/005868, in particular monovalent cations A and A' and bivalent cations B disclosed on page 11, line 1-27 through page 17, line 18 of WO 2016/005868. These organic cations A, A' and B are expressly incorporated herein by reference. A typical example of a second organic cation is methylammonium. Organic cations D, D' disclosed in WO2014/180789, page 23, line 11 through page 30, lines 12 are also enclosed by reference. Furthermore, organic cations A, A' and B disclosed in WO2014/180780, page 16, line 18 through page 23, line 10, are also enclosed herein by reference.

The second organic cation is preferably added in the precursor solution in the form of a salt, such that the precursor solution also contains the appropriate anion. Since the anions are also part of the perovskite to be formed, said anion of the second organic cation is preferably independently selected from halide anions, $CN^-$, $NCO^-$, $NCS^-$, $BF_4^-$, and $NCSe^-$. Preferred halides are $I^-$, $Cl^-$, $Br^-$ and $F^-$. The "second" anion may be the same or different from the anion of the first organic cation.

The perovskite solution may comprise further organic cations, such as a second, third, forth, etc. organic cation. Indeed, the perovskite to be formed may comprise more one or more, preferably two or more organic cations. Such further organic cations may be independently selected form the same cations as disclosed above by reference with respect to said second organic cation, for example as disclosed in WO2016/005868, WO2014/180789 and WO2014/180780.

In a preferred embodiment, said organic-inorganic perovskite to be deposited is a mixed organic cation perovskite. Accordingly, the perovskite comprises two or more organic cations, or an additional organic cation is in some way associated with said organic cation present in the perovskite.

It has been indicated above that the perovskite precursor solution preferably comprises all components that are required to provide said perovskite, which is preferably an organic-inorganic perovskite. Accordingly, the perovskite is preferably deposited in a one-step deposition process, where all components of the perovskite are contained in a single solution that is deposited during said step of depositing a perovskite precursor solution. In a preferred embodiment, the invention does not encompass and/or excludes the deposition of the perovskite in a two-step deposition process, wherein the metal halide and organic cation halide are contained in different solutions, which are deposited sequentially. However, in other embodiments, the invention also encompasses printing the perovskite by sequential deposition. Deposition in a single-step deposition of a solution containing all components of the perovskite is preferred.

The advantages of the present invention are most apparent if the precursor solution comprises all components required to form said organic-inorganic perovskite, because in this case there is generally an increased risk of undesired crystal formation, for example before application of the precursor solution. In the case of a printing ink, the crystal formation may occur on surface of the ink cartridge, at the nozzle, resulting in clogging of the nozzle. In particular, the invention addresses the problem of providing a perovskite precursor solution that is stable and suitable for printing techniques, such as inkjet printing.

In an embodiment, said precursor solution further comprises an inorganic cation, preferably a metal cation, and anions required for forming said organic-inorganic perovskite.

In accordance with the above, the perovskite precursor solution preferably comprises an inorganic cation, preferably a metal cation that will be present in the perovskite to be deposited.

In an embodiment, the inorganic cation is selected from divalent and trivalent metal cations, depending on the perovskite to be produced. In an embodiment, the inorganic cation is selected from the group consisting of $Cu^{2+}$, $Ni^{2+}$, $Co^{2+}$, $Fe^{2+}$, $Mn^{2+}$, $Cr^{2+}$, $Pd^{2+}$, $Zn^{2+}$, $Cd^{2+}$, $Ge^{2+}$, $Sn^{2+}$, $Pb^{2+}$, $Eu^{2+}$, $Yb^{2+}$, $Bi^{3+}$ and $Sb^{3+}$ and a combination of two or more of said metal cations.

In an embodiment, said perovskite precursor solution comprises a divalent metal cation selected from the group consisting of $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, $Yb^{2+}$ of two or more of said metal cations.

In a preferred embodiment, said metal cations are selected from $Pd^{2+}$ and/or $Sn^{2+}$.

The perovskite precursor solution preferably comprises the anions required to form said perovskite. The anions are preferably added as anions of said organic and inorganic cations, respectively. The anions in the precursor solution are preferably independently selected from the anions specified elsewhere in this specification, in particular halide anions, $CN^-$, $NCO^-$, $NCS^-$, $BF_4^-$, and $NCSe^-$. Preferred halides are $I^-$, $Cl^-$, $Br^-$ and $F^-$.

The invention preferably comprises the step of producing an organic-inorganic perovskite. Examples of such perovskites that are in particular suitable for perovskite solar cells have been disclosed. The perovskite deposited in accordance of the invention preferably distinguishes form previous reported perovskites in that a mixed organic cation perovskite is deposited, wherein said precipitation retarding compound preferably replaces some of the organic cation reported in such known perovskites.

In an embodiment, the organic-inorganic perovskite that is deposited in accordance of the invention has a structure formula selected from formula (II)-(VII):

$$AMX_3 \quad (II)$$

$$ANX_4 \quad (III)$$

$$AA'MX_4 \quad (IV)$$

$$AA'N_{2/3}X_4 \quad (V)$$

$$BN_{2/3}X_4 \quad (VI)$$

$$BMX_4 \quad (VII)$$

wherein,
A and A' represent each independently one or more organic cations as disclosed in this specification,
M is a bivalent metal cation as disclosed in this specification,
N is a trivalent metal cation as disclosed in this specification, and, X represents one or more identical or different anions as disclosed in this specification. Importantly, said anions in one structure may be the same or different. For example, in $AMX_3$ the three X of $X_3$ may be the same or different anions, in particular may include two or three different anions, such as $X^1$, $X^2$ and $X^3$, as discussed below.

In an embodiment, the present invention envisages that the deposited perovskite is a mixed anion perovskite.

In a preferred embodiment, the "precipitation retarding compound" is an organic cation that is integrated or associated with in said structure of formulae (II)-(VII). For example, if said "precipitation retarding compound" is a monovalent cation referred to as D, the material of formulae $AMX_3$ may be formally referred to as:

$$D_Y A_{1-Y} MX_3 \quad \text{(VIII)}$$

such that overall charge is 0.

Y is preferably <1, more preferably <0.5, even more preferably <0.3, and most preferably <0.25.

Furthermore, assuming that the two cations are added by way of salts with different anions ($AX^1$ and $DX^2$), and the metal is added as a salt of the same anion as the cation A ($MX^1_2$), the formula $AMX_3$ may be written as:

$$D_Y A_{1-Y} MX^1_{3-Y} X^2_Y \quad \text{(IX)}.$$

One may also envisage that the metal cation is added with two anions that are different from the AX anion or the DX anion.

For example, if the two metal anions $X^1_2$ are different from the A anion $X^2$, but the A and D are added as salts of the same anion $X^2$, the following formula ensues:

$$D_Y A_{1-Y} MX^1_2 X^2 \quad \text{(X)}$$

According to another example, the metal is added as $MX^1$, the organic cation is different and added as $AX^2$, but the retarding organic cation is added with the same anion as the metal ($DX^1$), the above referenced $AMX_3$ perovskite of formula (II) may have the following balanced formula:

$$D_Y A_{1-Y} MX^1_{2+Y} X^2_{1-Y} \quad \text{(XI)}$$

If, in accordance with another embodiment of the $AMX_3$ perovskite, all cations are added as salts of different anions, the following formula is obtained:

$$D_Y A_{1-Y} MX^1_Y X^2_{1-Y} X^3_2 \quad \text{(XII)},$$

in which of course $X^1$, $X^2$, and $X^3$ are the anions with which the crystal retarding cation D, the organic cation A and the metal anion are added, respectively.

In an embodiment, the perovskite deposited in accordance with the invention may thus be a mixed-organic cation and a mixed anion organic-inorganic perovskite.

In addition to the above, the present invention envisages that the perovskite comprises overall more than two organic cations, for example three organic cations. In an embodiment, the perovskite is a perovskite (mixed-organic cation embodiment of formula (II)) as follows:

$$D_Y A^1_Z A^2_{1-Y-Z} M\, X^1_Y X^2_Z X^3_{1-Y-Z} X^4_2 \quad \text{(XIII)}$$

wherein Y+Z<1; Y>0 and Z≥0;
$X^1$, $X^2$, $X^3$ and $X^4$ are independently selected from the anions disclosed in this specification, and may be the same or different,
M is a bivalent metal cation selected from the metal cations disclosed elsewhere in this specification,
D is a cation selected from the "precipitation retarding compounds" as disclosed elsewhere, for example a cation of formula (I).

In formula (XIII), Z may be 0, resulting in a mixed organic cation perovskite comprising two organic cations.

The invention further envisages the perovskite of formula (II) above $AMX_3$ comprises overall two to four different organic cations D, $A^1$, $A^2$, and $A^3$:

$$D_Y A^1_Z A^2_K A^3_{1-Y-Z-K} MX^1_Y X^2_Z X^3_{1-Y-Z} X^4_{1-Y-Z-K} X^5_2 \quad \text{(XIV)}$$

wherein Y+Z+K<1; Y>0, and Z≥0, K≥0.
$X^1$, $X^2$, $X^3$, $X^4$ and $X^5$ are independently selected from the anions disclosed in this specification, and may be the same or different,
M is a divalent metal cation selected from the metal cations disclosed elsewhere in this specification,
D is a cation selected from the "precipitation retarding compounds" as disclosed elsewhere, preferably a cation of formula (I).

In accordance with the invention, the perovskites of formulae (III)-(VII) may be extended in analogy with the above exemplary formulae (VIII)-(XIV) to represent mixed organic cation and/or mixed anion perovskites.

The above formulae derived from formula (II) may assume that A and M, D and A or D, $A^1$, $A^2$, as applicable, are present such that the amount of M atoms is equivalent to the total of A, D, $A^1$, and $A^2$ atoms, as applicable, depending on the definition of Y+Z+K.

In some embodiments of the invention, the overall amounts of organic cations may exceed the amount of metal cations, in particular in the ink used for printing the perovskite. Accordingly, organic cations may be present in excess, compared to the metal cations, so as to possibly result in non-stochiometric presence or ratios between cations compared to the structures of formulae (II)-(XIV), for example. In this case, anions are preferably present so as to provide an overall neutral composition. Accordingly, the anions are preferably also added in excess, to the same extent as the presence of cations does not correspond to the stochiometric definitions implied in formulae (II)-(XIV).

In an embodiment of formula (VIII) above, where an organic anion is added in excess, the perovskite ink may be prepared based on the following perovskite composition of formula (XV):

$$D_O A_P MX_T \quad \text{(XV)}$$

wherein O+P>1, preferably 2>O+P>1.
T=O+P, wherein X represents the same or different anions.

The formulae (IX) through (XIV) may be rewritten accordingly.

For example, referring to formula (XIV), the perovskite precursor solution may be prepared based on components resulting in a theoretical perovskite of the following formula (XVI):

$$D_O A^1_P A^2_Q A^3_R MX^1_2 X^2_O X^3_P X^4_Q X^5_R \quad \text{(XVI)}$$

wherein,
M is a divalent metal cation as defined above;
D, $A^1$, $A^2$, $A^3$ are organic cations as defined above, preferably monovalent cations,
$X^1$, $X^2$, $X^3$, $X^4$, $X^5$ are anions as defined above, preferably monovalent anions, which may be the same or different,
O>0, P>0, Q≥0, R Q≥0, and
O+P+Q+R≥1, preferably >1.

Accordingly, $X^1$ and $X^2$, may be different anions, for example different halide anions, or may be the same anion, for example the same halide anion.

More preferably, 2>O+P+Q+R≥1, even more preferably 1.5>O+P+Q+R.

Preferably, $1.2 \geq O+P+Q+R \geq 1$, even more preferably $1.1 > O+P+Q+R \geq 1$.

In a preferred embodiment, $1.08 \geq O+P+Q+R \geq 1$. In a practical embodiment, $O+P+Q+R=1.05$ (5% percent excess of organic cations compared to M).

In an embodiment, $R=0$, such that there are not more than 3 different organic cations. Even more preferably, $Q=R=0$, such that there are not more than 2 different organic cations. p The preferred amounts of the sums apply also to this embodiment ($2>$, $1.5 \geq$, $1.2 \geq$, $1.1 \geq$).

In a preferred embodiment, $P+Q+R=1$, $1>O>0$, $P>0$, $Q \geq 0$, $R \geq 0$. Accordingly, $A^2$, $A^3$ may be absent, and D is added in excess, because $P+Q+R=1$.

Preferably, $A^1$ = methyl ammonium.

Accordingly, M on the one side and $A^1$, $A^2$, $A^3$, together, on the other side (and in as far as present) may be present at a 1:1 ratio, with D, the retarding organic cation being added in excess. If $A^2$, $A^3$ are absent, in accordance with a preferred embodiment, then $A^1$ and M are present in a 1:1 ratio and D is added in excess.

It is noted that the excess of organic cations compared to the metal cation can be obtained in other ways, as long as $O+P+Q+R>1$. For example, $A^1$ and M may be provided in 0.9:1 molar ratio, and D may be present at a 0.2 molar ratio, such that $O+P=1.1$ (assuming Q, R $=0$).

In accordance with the above, when preparing the ink and/or the perovskite precursor solution, organic cations and metal cations are added such that there is an excess of organic cations, compared to the stoichiometry of the general perovskite formula $AMX_3$, or compared to the stoichiometry of any one of formulae (II)-(VII). There is preferably a 0.1-10%, preferably 1-8%, for example a excess of about 5% of organic cations. Percent here refers to excess in mol. %. Preferably, the "retarding compound", for example the cation $Anc-R^1$—$W^+$, is added in said excess, whereas remaining organic cations, such as methyl ammonium cation, are added stoichiometrically and/or in an equimolar manner with respect to the metal cation in the precursor solution.

While formulae (II)-(XVI) are frequently used to describe a particular perovskite crystal, it is understood that, for the purpose of the present specification, these formulae are used to refer to the ratios of components used for preparing the perovskite precursor solution. The present invention is more generally about a perovskite ink and or perovskite precursor solution that can be used for printing organic inorganic perovskites, for example by inkjet printing.

Accordingly, the above formulae (II)-(XVI) preferably represent the constituents of the components in the perovskite precursor solution. Accordingly, the perovskite precursor solution is prepared by mixing solutes assuming that a perovskite according to one of these formula is obtained, whether or not the corresponding perovskite has indeed the supposed structure formula. Referring to formula (XVI), the following components may be added to the solvent in order to obtain the precursor solution: $MX^1_2$, $DX^2$, $A^1X^3$, $A^2X^4$, $A^3X^5$. More specifically, a precursor solution comprises amounts of $MX^1_2$, $DX^2$, $A^1X^3$, $A^2X^4$, $A^3X^5$ in the molar ratios of 1:O:P:Q:R. If Q, R=0, the following components are dissolved in the solvent, in appropriate molar amounts, in order to obtain the precursor solution: $MX^1_2$, $DX^2$, $A^1X^3$, at 1:O:P.

The perovskite precursor solution preferably comprises one or more solvents, in which the components of the precursor solution are dissolved. In an embodiment, the solvent is selected from the group consisting of: gamma-butyrolactone (GBL), DMF, DMSO, isopropanol, acetonitrile, and mixtures comprising two or more of the aforementioned. The invention is preferably not limited to any particular solvent, but solvents or mixtures or solvents may be selected, for example with the goal of adjusting the viscosity of the solvent so as to optimize the suitability for the inkjet printing. In an embodiment, the solvent comprises a mixture of GBL and acetonitrile.

In a preferred embodiment, the method of the invention comprises the step of depositing said precursor solution through a printing nozzle. In an embodiment, the perovskite precursor solution is deposited by inkjet printing.

In a preferred embodiment of the method of the invention, during depositing by printing, the temperature of said precursor solution is in the range of 5-70° C., preferably 10-60° C., more preferably 15-50° C., and most preferably 20-40° C. In an embodiment, during depositing by printing, the temperature of said precursor solution is above room temperature (25° C.), preferably $\geq 27°$ C., for example more than 25° C. and up to 50° C. Preferably, the temperature is controlled to be in the indicated ranges.

In a preferred embodiment of the method of the invention, the precursor solution is not heated during printing. Accordingly, the step of depositing by printing may take place at ambient temperature, for example at room temperature (25° C.), or indeed at any temperature in the range of 15-30° C., preferably 20-30° C., for example, without the need of providing active or purposeful heating if the precursor solution. In an embodiment, a heater in the printing cartridge may be absent or non-activated during the deposition by printing.

In a preferred embodiment, said perovskite precursor solution has one or more of the properties selected from the group consisting of:

a density $\delta$ (kg/m$^3$) of >800, preferably >1000;

a surface tension $\gamma$ (dyne/cm) of 15-55, preferably 20-50; and a solvent boiling point (° C.) of >80° C., preferably >100° C.

The property related to density and surface tension applies preferably at RT (25° C.).

In a preferred embodiment, during depositing by printing, the precursor solution is deposited with one or more selected from the group consisting of:

a drop spacing in the range of 1-50 µm;

by applying a customized waveform with 1-30 V amplitude and 0.1-50 kHz frequency.

In an embodiment, said precursor solution is deposited in the form of droplets having a volume of 0.5-20 picolitres, preferably 1-12 picolitres, more preferably 3-12 picolitres and most preferably 5-10 picolitres.

In an embodiment, said precursor solution is deposited by drop-on-demand (DOD) inkjet printing, for example by piezoelectric DOD inkjet printing. In another embodiment, the precursor solution is deposited by thermal DOD inkjet printing.

In an embodiment, said precursor solution is deposited by forcing the solution through a nozzle having an opening diameter of 10-100 µm, preferably 15-80 µm, more preferably 20-70 µm, most preferably 20-60 µm.

An advantage of the present invention is that precise amounts of precursor ink can be deposited, and that such amount can be distributed regularly over the surface that is to be covered, in particular the active surface of the solar cell.

In an embodiment, the method of the invention comprises depositing 5-50 µl, preferably 10-40 µl, more preferably 15-30 µl even more preferably 20-27 µl and most preferably 21-26 µl per cm². These amounts are preferably deposited with respect to one (1) cm² of the active surface of the perovskite solar cell.

Thanks to the stability of the perovskite ink of the invention, the method of the invention allows for depositing comparatively larges surfaces of perovskites, preferably in a continuous manner. Laboratory perovskite solar cells, typically have a surface of 1 cm². The present invention encompasses printing perovskite ink on surfaces larger than 1 cm², preferably larger than 10 cm², more preferably larger than 50 cm². In an embodiment, the method of the invention encompasses printing perovskite layers on surfaces of 90 cm²100 cm² or larger. Indeed, the occurrence of stable ink in accordance with the invention allows depositing perovskite layers by printing on surfaces of 200 cm² or larger, 300 cm² or larger 400 cm² or larger 500 cm² or larger, and even surfaces of sizes in the dm² or m² range. Such surfaces can be deposited in continuous, non-interrupted deposition processes, where printing nozzles operate continuously for covering the desired surface. It is noted that such surfaces may encompass and/or be comprised of units or partial surfaces of smaller area sizes. The units of smaller areas may be provided on a single or on different support substrate during the continuous deposition process. However, the invention encompasses depositing a plurality of cell units in a continuous manner, so as to overall cover the indicated surface areas.

Preferably, printing cartridges with comparatively large volumes may be used, exceeding the typical laboratory cartridge sizes in the 1-3 ml range. For example, a cartridge with perovskite precursor ink having a volume of larger than 5 ml may be used, preferably larger than 10 ml, more preferably larger than 50 ml, even more preferably larger than 100 ml, and most preferably equal to or larger than 500 ml. The invention encompasses the use of cartridges having volumes in the range of 1 to several litres. Accordingly, in an embodiment, the invention provides the use of an inkjet printer that can be equipped with one or more cartridges, cartridge having the above indicated volumes for depositing at least part of an organic-inorganic perovskite in accordance with the invention.

The present invention provides large scale and/or industrial scale deposition of perovskites, as well as large scale and/or industrial scale production of solar cells as compared to the lab-scale deposition disclosed so far in the literature.

In an embodiment, during said step of depositing said perovskite, one or more steps selected from drop-casting, spin-coating, dip-coating, curtain coating are absent.

In an embodiment, the substrate on which the perovskite is deposited, such as a precursor solar cell comprising, for example, at least a surface increasing structure, is not heated during the printing of the perovskite precursor solution. Preferably, there is absence of heating of a platen or other substrate on which the precursor solar cell comprising the substrate for depositing the perovskite is deposited during the perovskite deposition process.

In an embodiment, the method of the invention comprises depositing a mesoporous n-type semiconductor layer (e.g. mesoporous $TiO_2$ layer) having a thickness of 100 nm-1 µm, preferably 300-700 nm, more preferably 400-600 nm, even more preferably 450-550 nm. Preferably, the amounts of precursor solution above apply to such solar cells.

In an embodiment, the method of the invention comprises depositing a mesoporous insulating or space layer (e.g. mesoporous $ZrO_2$ layer) having a thickness of 0.7-3.2 µm, preferably 0.9-2.8 µm, more preferably 1.0-2.5 µm, and most preferably 1.2-1.6 µm. Preferably, the amounts of precursor solution above apply to such solar cells.

In an embodiment, the method of the invention comprises depositing a mesoporous and/or surface increasing layer comprising an n-type semiconductor (such as $TiO_2$) and a mesoporous insulating or space layer (e.g. $ZrO_2$) having, both together, an overall thickness of 0.9 µm or thicker, preferably 1.2 µm or thicker, more preferably 1.4 µm or thicker, even more preferably 1.6 µm and thicker, and most preferably 1.8 µm or thicker. Preferably, the amounts of precursor solution above apply to such solar cells.

In an embodiment, the combined mesoporous n-type semiconductor and space layers deposited in accordance with the method of the invention have an overall thickness of 1.0-2.7 µm, preferably 1.3-2.5 µm, more preferably 1.5-2.3 µm, and most preferably 1.7-2.2 µm.

Preferably, the amounts of precursor solution above apply to such solar cells.

The thicknesses of the mesoporous layers as specified hereinabove preferably apply to the thickness of the appropriate layer in the final solar cells, that is, after generally or optionally used, additional processing steps such as sintering have been performed. This means that the thickness at deposition may be and generally is higher at the amount indicated, but may be reduced following sintering, for example, to have the above thicknesses. The thickness may be determined with a profilometer or by electron microscopy, for example.

In an embodiment, the method of depositing a perovskite is suitable in a method of manufacturing a perovskite solar cell or at least parts of a perovskite solar cell. In such cells, the organic-inorganic perovskite preferably functions as a light harvester and/or light absorbing material.

Figure 10:
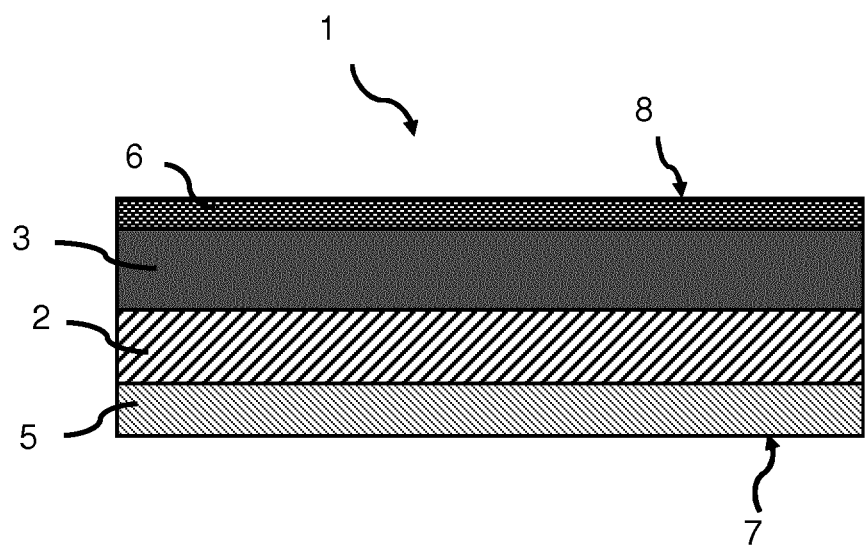
FIG. 10 schematically shows the structure of a solar cell according to an embodiment of the invention.

FIG. 10 schematically illustrate an exemplary solar cell 1 that may be prepared in accordance with the invention. The solar cells of the invention are generally flat and/or preferably layered devices, comprising two opposing sides 7 and 8. The solar cell is arranged such that one of the two flat sides will be exposed to a light source, such as to generate electricity. In the embodiment shown in FIG. 10, it is preferably the flat surface 7 that is intended to be exposed to light.

The device in FIG. 10 comprises a conducting current collector layer 5, an n-type semiconductor layer 2, a light harvester or sensitizer layer 3, and a conducting electron providing layer 6.

A hole transport layer may but need not be provided between said light harvester layer 3 and said current providing layer 6. A hole transport layer may comprise an organic hole transport material. In an embodiment, the solar cell prepared in accordance with the invention lacks a hole transport layer and/or the method of the invention lacks a step of depositing a hole transport layer.

The method of the invention may comprise the step of providing a conductive layer, for example a conductive transparent substrate comprising said conducting current collector layer 5. In some embodiments, the current collector comprises a material selected from indium doped tin oxide (ITO), fluorine doped tin oxide (FTO), $ZnO-Ga_2O_3$, $ZnO-Al_2O_3$, tin oxide, antimony doped tin oxide (ATO), $SrGeO_3$ and zinc oxide, or combinations thereof.

The method preferably further comprises the step of depositing at least one n-type semiconductor layer 2. Suitable semiconductor materials are known to the skilled person. They may be selected, for example, from metal oxides having the appropriate electronic properties. In an embodiment, the n-type semiconductor layer 2 is deposited from a material selected from the group consisting of: Si, $SiO_2$, $TiO_2$, $Al_2O_3$, $ZrO_2$, $HfO_2$, $SnO_2Fe_2O_3$, ZnO, $WO_3$, $Nb_2O_5$, $In_2O_3$, $Bi_2O_3$, $Y_2O_3$, $Pr_2O_3$, $CeO_2$ and other rare earth metal oxides, CdS, ZnS, PbS, $Bi_2S_3$, CdSe, CdTe, $MgTiO_3$, $SrTiO_3$, $BaTiO_3$, $Al_2TiO_5$, $Bi_4Ti_5O_{12}$ and other titanates, $CaSnO_3$, $SrSnO_3$, $BaSnO_3$, $Bi_2Sn_3O_9$, $Zn_2SnO_4$, $ZnSnO_3$ and other stannates, $CaZrO_3$, $SrZrO_3$, $BaZrO_3$, $Bi_4Zr_3O_{22}$ and other zirconates, combinations of two or more of the aforementioned and other multi-element oxides containing at least two of alkaline metal, alkaline earth metal elements, Al, Ga, In, Si, Ge, Sn, Pb, Sb, Bi, Sc, Y, La or any other lanthanide, Ti, Zr, Hf, Nb, Ta, Mo, W, Ni or Cu.

In an embodiment, the solar cell of the invention comprises a surface-increasing structure. In some embodiments, the semiconductor layer 2 or part thereof has a surface increasing structure. The surface-increasing structure may be formed by nanoparticles that are applied on the current collector or on an optional underlayer, such as a dense or compact (preferably n-type) semiconductor layer. If present, the dense underlayer is preferably deposited onto the conductive transparent substrate, and the surface increasing structure is then deposited on top of the dense underlayer. The dense (or compact) underlayer may be deposited, for example, by slot-coating, screen-printing, sol-gel deposition or spray pyrolysis, as illustrated in FIG. 1. The underlayer and the surface increasing, nanoporous structure preferably comprises the same n-type semiconductor material.

The expression "nanoparticles" encompasses particles or particulate elements, which may have any form, in particular also so-called nanosheets, nanocolumns and/or nanotubes, for example. Nanosheets made from anatase $TiO_2$ have been reported by Etgar et al., Adv. Mater. 2012, 24, 2202-2206, for example. Preferably, the nanoparticles comprise or consist essentially of said semiconductor material.

The surface increasing structure may also be prepared by screen printing or spin coating, for example as is conventional for the preparation of porous semiconductor (e.g. $TiO_2$) surfaces in heterojunction solar cells, see for example, Noh et al., Nano Lett. 2013, 7, 486-491 or Etgar et al., Adv. Mater. 2012, 24, 2202-2206. Nanoporous semiconductor structures and surfaces have been disclosed, for example, in EP 0333641 and EP 0606453.

According to an embodiment of the invention, said surface-increasing structure comprises and/or is prepared from nanoparticles, in particular nanosheets, nanocolumns and/or nanotubes, which nanoparticles are preferably further annealed.

According to an embodiment, the surface-increasing structure and/or said n-type semiconductor is nanostructured and/or nanoporous. In an embodiment, said semiconductor material is mesoporous and/or mesoscopic. According to an embodiment, the surface-increasing structure and/or said semiconductor material is nanocrystalline.

Preferably, said surface-increasing structure is provided by said n-type semiconductor material. In some embodiments, the surface increasing structure is not an n-type semiconductor material, but may be, for example, an insulating material. In this case, there is generally the compact underlayer made from n-type semiconductor material, and the surface-increasing structure does not cover the underlayer entirely, such that the perovskite layer can get in contact with the underlayer.

The light harvester or sensitizer layer 3 is preferably deposited by printing, preferably inkjet printing in accordance with the invention. The perovskite and the n-type semiconductor, in particular said porous n-type semiconductor preferably provides a photoanode and/or active electrode.

The conducting current providing layer 6 is preferably a counter electrode, which generally comprises a material that is suitable to provide electrons and/or fill holes towards the inside of the device. This material may be a catalytically active material. The counter electrode may, for example, comprise one or more materials selected from (the group consisting of) Pt, Au, Ni, Cu, Ag, In, Ru, Pd, Rh, Ir, Os, C, including carbon, graphene and graphene oxide, conductive polymer and a combination of two or more of the aforementioned, for example. Conductive polymers may be selected from polymers comprising polyaniline, polypyrrole, polythiophene, polybenzene, polyethylenedioxythiophene, polypropylenedioxy-thiophene, polyacetylene, and combinations of two or more of the aforementioned, for example.

The counter electrode may be applied as is conventional, for example by thermal or electron beam evaporation, sputtering or a printing or spraying process of the counter electrode material, optionally dispersed or dissolved in a water or solvent-based carrier medium, for example. In some embodiments discussed below, the counter electrode is made from a porous material, such as a porous carbon material.

The solar cell of the invention may comprise more layers and/or materials as appropriate. Many different types and/or structures of perovskite solar cells have been reported, including cells where the nanoporous, surface increasing structure is made from an insulating material, and a perovskite material is in contact with a semiconductor under layer, such as a dense or compact n-type semiconductor underlayer.

In a preferred embodiment, the method of the invention concerns the manufacturing of a perovskite solar cell in which a porous counter electrode is deposited before deposition of the perovskite precursor solution, and the precursor solution is deposited onto the porous counter electrode so as to infiltrate the latter and to get in contact with the surface increasing structure, preferably filling the pores of the latter.

In an embodiment, such cells comprise a subassembly or sub-entity comprising at preferably at least a porous n-type semiconductor layer, a porous insulating or space layer, a porous counter electrode and a perovskite deposited to be in contact with said porous n-type semiconductor layer. Such a configuration has been disclosed, for example, at the example of the $TiO_2/ZrO_2/C$ configuration disclosed in reference 21 (Z. Ku et al, 2013) and reference 12 (A. Mei et al, 2014).

The particularity with cells comprising such a subassembly is that the counter electrode is porous and is deposited before the deposition of the perovskite. Without wishing to be bound by theory, it is speculated that the above is possible because a space layer has been provided, for example comprising and/or consisting of an insulating material, such as $ZrO_2$, on top of the n-type semiconductor layer. For the purpose of the present invention, an insulating material is a material through which electrons will not flow by electronic motion during operation of the device under normal circumstances.

In an embodiment of the method of the invention, said perovskite precursor solution is deposited per printing the precursor solution on a porous counter electrode layer so as to infiltrate said porous counter electrode layer. For example, said porous counter electrode is a porous carbon electrode. The carbon electrode may be deposited by screen printing, for example.

The porous counter electrode, which may be made, for example, from porous carbon, is deposited on top of the space layer. The space layer prevents the counter electrode to be in direct contact with the n-type semiconductor layer.

Preferably, the space layer is porous, so as to allow access of the perovskite to the semiconductor layer during the perovskite deposition. Preferably, the space layer is meso- and/or nanoporous. In space layer may be deposited by screen printing, for example. Preferably, the space layer is also made from nanoparticles as defined herein, but said nanoparticles have preferably larger dimensions compared to the dimensions of the n-type semiconductor nanoparticles. The dimension of the space layer particles are preferably selected such as not to fill up the pores provided by the porous n-type semiconductor layer.

Surprisingly, the present invention makes it possible to deposit the perovskite in liquid form by inkjet printing on top of the porous counter electrode and across the same and across the space layer such that the perovskite gets in contact with said n-type semiconductor layer. Preferably, enough perovskite is deposited so as to provide an electric contact between the n-type semiconductor and the counter electrode, for example by said perovskite. As indicated above, the space layer is preferably porous, so as to allow the perovskite to get to across the porous counter electrode layer, the space layer to be in contact with said n-type semiconductor layer and fill the pores of the surface increasing structure and preferably also the pores provided in in the space layer.

Without wishing to be bound by theory, it is believed that the perovskite is in contact with said porous n-type semiconductor, and it is also expected that the perovskite be in contact with said insulting layer and said counter electrode. The perovskite is thus preferably integrated in the porous n-type semiconductor layer and, if present, said insulating layer, and possibly in part of said porous counter electrode. In such embodiments, an entire layer consisting exclusively of perovskite may be absent.

In some embodiment, the method of the invention comprises the step of exposing the perovskite, after it has been deposited, to heat, for example one or more heat treatments. Preferably, the perovskite is exposed to 30-80° C. for 5-120 minutes, preferably 35-70° C. for 10-90 minutes, most preferably 40-60° C. for 15-60 minutes.

In some embodiments, one, two or more heating steps are applied, with or without letting the deposited perovskite cool down, for example to room temperature (25° C.) or lower, or to a temperature below the heating temperature, between heating steps. The heating is preferably provided to remove solvent and thereby ensure complete growth of the perovskite crystal. In an embodiment, the deposited perovskite, for example in the completely or partially assembled solar cell, is heated while being in a closed contained, and in a subsequent heating step, the perovskite is heated outside said closed container, allowing for solvent evaporation.

In some embodiments, solar cells prepared in accordance with the invention are stored in the dark, for example for 1 day to 8 weeks, more preferably 2 days to 6 weeks, most preferably 1 week to 5 weeks. Preferably, the cells are stored in vacuum or in an inert atmosphere, that is an atmosphere with reduced or absent moisture ($H_2O$ and oxygen ($O_2$) during this time. In some embodiments, the storage takes place in a reduced moisture environment, for example an environment which is protected from external moisture.

As shown in FIG. 1, thanks to depositing perovskite efficiently by inkjet printing, the entire solar cell may be deposited by scalable techniques, including in particular scalable printing techniques, allowing industrial production of the solar cells on a large scale. Starting from the transparent conductive substrate, which in this example is FTO glass (step a), all subsequent steps can be scaled up. The FTO glass may be replaced by any transparent conductive substrate, including conductive plastic, for example. The conductive layer on the conductive support layer may be patterned by one or more selected from laser patterning, chemical, such as chemical wet etching, and mechanical abrasion, for example (step b), for example. Conductive contacts, for example silver contacts may be deposited by printing (step c). A dense or compact n-type semiconductor layer, for example $TiO_2$, may be deposited by spray pyrolysis (step d), for example. A mesoporous n-type semiconductor layer, for example mesoporous $TiO_2$, may be deposited by screen printing (step e). The mesoporous insulating or space layer, comprising, for example $ZrO_2$ nanoparticles, may be deposited by screen printing (step f). The porous counter electrode, for example a porous carbon layer, may be deposited by screen printing (step g). Finally, the perovskite layer may be deposited by inkjet printing onto the porous counter electrode (step h), including infiltration of the latter and diffusion of the perovskite-ink to the n-type semiconductor layer, where an organic-inorganic perovskite is formed. Sintering steps, which may be conducted as appropriate and according to known processes are not shown in FIG. 1.

In a preferred embodiment, the invention concerns solar cells obtained by the methods of the invention. In some embodiments, such solar cells have the following layers and/or materials: A conductive, preferably transparent substrate layer, a dense n-type semiconductor layer, a mesoporous n-type semiconductor layer, a mesoporous space layer, a porous counter electrode layer, and a perovskite, the perovskite extending at least inside said porous n-type semiconductor layer and preferably being in contact with said counter electrode layer.

In some embodiments, the invention concerns subassemblies of solar cells obtained by the methods of the invention. In some embodiments, such subassemblies have the following layers and/or materials: A mesoporous n-type semiconductor layer, a mesoporous space layer, a porous counter electrode layer, and a perovskite, the perovskite extending at least inside said porous n-type semiconductor layer and preferably being in contact with said counter electrode layer.

The present invention will now be illustrated by way of examples. These examples do not limit the scope of this invention, which is defined by the appended claims.

EXAMPLES

Example 1: Solar Cells in Accordance with an Embodiment of the Invention

1. Preparation of Solar Cells for Deposition of Precursor Solution

Triple layer solar cells of the configuration $TiO_2/ZrO_2/C$, deposited on a conducing transparent substrate but yet lacking a perovskite light harvester were prepared as follows.

Fluorine doped tin oxide (FTO) coated glass substrates (10×10 $cm^2$, $R_{SH}$=7 Ω/Sq, Product code: TCO22-7, Solaronix) were first etched with an automated fiber laser, and cleaned by sequential sonications in Hellmanex 1% aqueous solution, acetone, and isopropanol (15 min each). Then a compact layer of $TiO_2$ (30-40 nm) was deposited by spray pyrolysis over the etched glass substrates placed on a hot-plate set to 550° C., of a diluted solution of titanium diisopropoxide bis(acetylacetonate) (75% in isopropanol, Sigma-Aldrich) in absolute ethanol (1:80) using oxygen as a carrier gas. Areas of the substrate had been masked with glass strips to prevent the coating in the subsequent silver areas. After cooling down to room temperature, a silver paste (Sun Chemical CRSN2442) was screen-printed and dried at 150° C. for 15 min to obtain silver contacts for anode and cathode. The 500 nm thick mesoporous $TiO_2$ layer was obtained by screen-printing (diluted Ti-Nanoxide T/SP in terpineol, Solaronix) on the compact $TiO_2$ layer followed by drying at 150° C. for 5 min, and sintering at 500° C. for 15 min. Similarly, the insulating mesoporous $ZrO_2$ layer was also obtained by screen-printing (Zr-Nanoxide ZT/SP, Solaronix) on the aforementioned $TiO_2$ layer, drying at 150° C. for 5 min, and sintering at 500° C. for 30 min. The thickness of the $ZrO_2$ was tuned by stacking 1-4 prints before sintering. The conductive porous carbon electrode was fabricated by screen-printing a carbon paste (Elcocarb B/SP, Solaronix), drying at 150° C. for 5 min, and firing at 400° C. for 30 min.

2. Preparation of the Perovskite Precursor Ink Formulation

The perovskite precursor ink for this experiment was prepared by mixing 0.53 g of $PbI_2$ (TCI Chemicals), 0.19 g of methyl ammonium iodide (MAI, Dyesol) and 0.0176 g of 5-ammonium valeric acid iodide (5-AVAI, Dyesol) in 1 ml of gamma-butyrolactone (Sigma Aldrich) in a glass vial under a laboratory fume hood. The glass vial was sealed and placed for stirring for 30 min on a preheated (at 70° C.) hot-plate. The ingredients were completely dissolved and a clear yellow solution was obtained that was allowed to cool down to room temperature. The ink was then transferred to the inkjet printer cartridge. The perovskite precursor ink remained stable both in glass vial and in the printer cartridge for more than 2 weeks and no precipitation or precipitation of the solutes was observed. Table 1 below shows the characteristics of the perovskite precursor ink.

TABLE 1

Characteristics of the perovskite precursor ink used in this study:
$\rho$ = ink density, $\gamma$ = surface tension of the ink,
BP = boiling point of the solvent, and their optimal values specified by the inkjet printer manufacturer.

| Characteristic | Perovskite precursor ink value | Optimal value |
|---|---|---|
| $\rho$ (kg/m$^3$) | 1150 | >1000 |
| $\gamma$ (dyne/cm) | 33.367 ± 0.02664 | 28-42 |
| BP (° C.) | 204 | >100° C. |

3. Inkjet Infiltration of the Perovskite Precursor Ink

Figure 8:
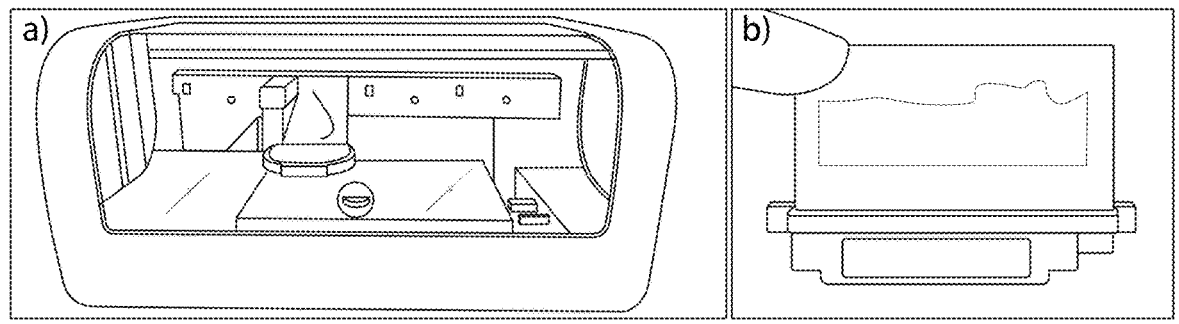
FIG. 8 shows a) Fujifilm's Dimatix inkjet printer (Model DMP-2831) which was used for depositing a perovskite in accordance with an embodiment of the invention, and the b) printer cartridge filled with perovskite precursor ink and used with the device shown in a).
Figure 9:
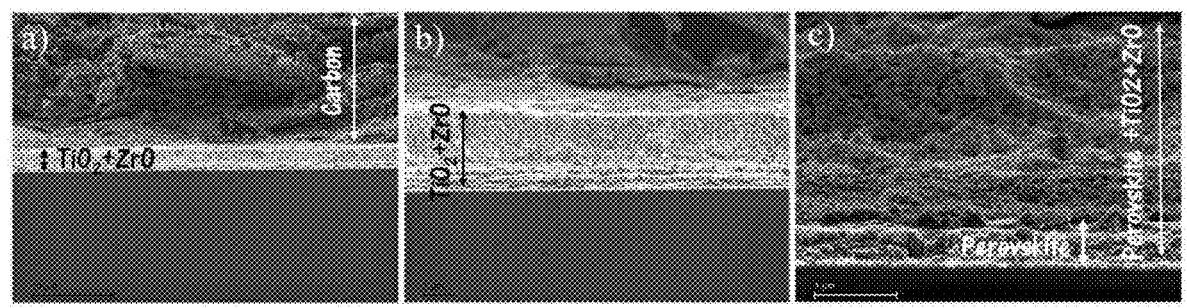
FIG. 9 shows cross-sectional SEM images of triple layer ($TiO_2/ZrO_2/C$) perovskite solar cells fabricated in accordance with embodiments of the invention.
Figure 2:

Perovskite precursor ink was infiltrated on carbon electrode with a drop-on-demand Dimatix materials inkjet printer (DMP-2831, Dimatix-Fujifilm Inc., USA, FIG. 8) at 30° C. printing temperature with 15 μm drop spacing and by applying a customized waveform with 18V amplitude and 1-8 kHz frequency. The platen was kept at room temperature whereas the relative humidity inside the printer hood was ~32%. After infiltration, the PSCs were kept in the closed plastic box and were placed in a preheated oven at 50° C. for 30 minutes. After that the lid of the plastic box was removed and the PSCs were further heated for 1 more hour at 50° C. in the oven to ensure the complete growth perovskite absorber layer and were then removed from it and were kept in vacuum prior measurements.

4. Measurements

The J-V curves of the fabricated PSCs were measured in a Xenon based artificial solar simulator (Peccell Technologies, PEC-L01, Japan) under 1000 W/m$^2$ light intensity equivalent to 1 Sun with a reference solar cell (PV measurements Inc) by employing black tape mask with an aperture area 0.16 cm$^2$. Cross sectional images of PSCs were recorded with scanning electron microscope (Zeiss Ultra 55 FEG-SEM). The thickness of deposited layers was measured with a stylus based profile meter (Veeco instruments). The surface tension of the perovskite precursor ink was measured with CAM 200 goniometer (KSV Instruments). The long term stability test of the perovskite solar cells test was executed by keeping them for 1046 hours at open circuit conditions at 35° C. in a home-made solar simulator under 1 Sun light intensity provided through halogen lamps (Philips 13117) and a UV filter (Asmetec GmbH, 400 nm cut-off), while recording their J-V curves periodically in the abovementioned solar simulator (Peccell Technologies, Japan). X-ray diffraction (XRD) data was collected on a Bruker Advance D8 X-ray diffractometer with a graphite monochromator, using Cu-Kα radiation, at a scanning rate of 1 deg/min.

5. Results

We observed very high stability of perovskite precursor ink, which was formulated by mixing the $PbI_2$ and MAI with the 5-AVAI that has been used earlier as templating agent to improve the crystalline network and charge-carrier lifetime of the $CH_3NH_3PbI_3$ [12].

However, one key characteristic of 5-AVAI and related compounds as specified in this specification was not highlighted before this report: it significantly slows down the perovskite precipitation before and after the deposition of the precursor ink thus preventing the inkjet printer cartridge from clogging and provides an opportunity for precise patterning and controlled volume dispensing of precursor ink.

Figure 2:
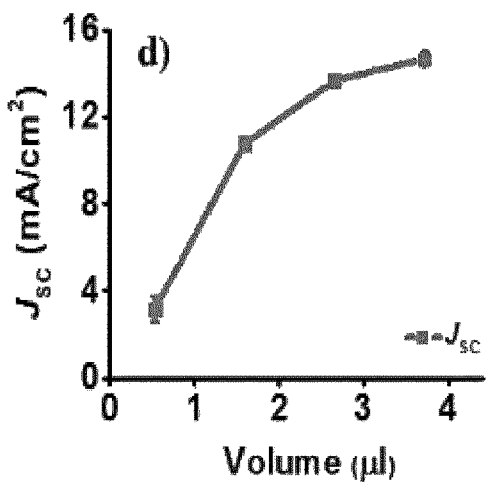
FIGS. 2A and 2B shows the controlled dispensing of perovskite precursor ink according to an embodiment of the invention. Volume was systematically incremented to show the precise tuning of photovoltaic parameters of perovskite solar cells according to an embodiment of the invention.
FIG. 2C shows exemplary images printed with a precursor ink in accordance with an embodiment of the invention. The images show (a) logos of the collaborative partners of this work (b) QR code for Aalto University's official website.
Figure 2:
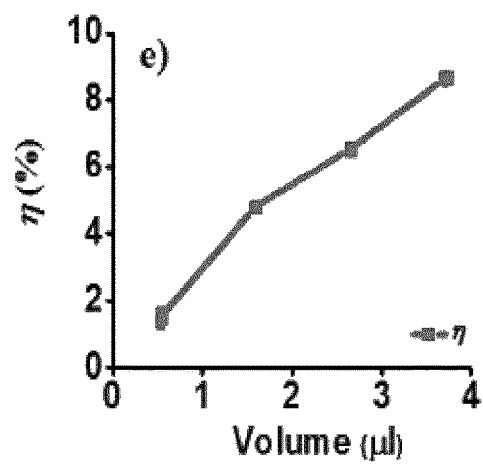

The capabilities of the precursor ink printed or infiltrated through inkjet printer are depicted in FIGS. 2 A-C where high quality precise patterning of logos of all the collaborators of this work, along with the printing of the QR-code and bitmap version of a digital image was performed over commonly available Xerox paper (FIG. 2 C). These demonstrations have been attributed due to precise dispensing of known volumes of the perovskite precursor ink which were also used to tune the photovoltaic performance of carbon based PSCs in this experiment while keeping the thickness of separator layer (here $ZrO_2$) constant (FIGS. 2A and 2B).

Figure 3:
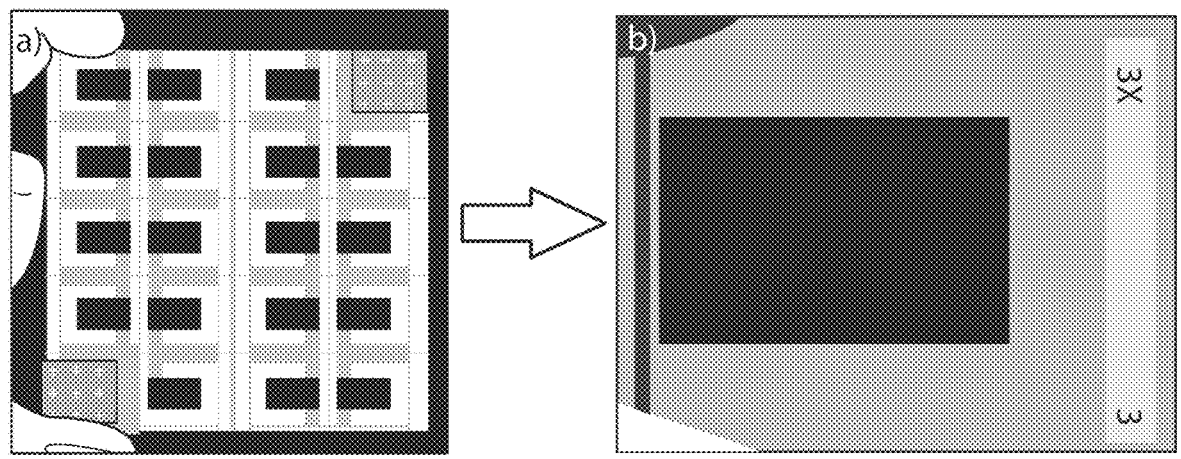
FIG. 3 shows photographs of solar cells prepared according to an embodiment of the invention. a) A 10 cm×10 cm FTO-Glass plate having 18 PSCs obtained with all scalable processes as described in FIG. 1 *a-h* before the inkjet printing b) A PSC from the plate after inkjet infiltration of perovskite precursor ink.
Figures 4A, 4B, 4C, 4D:
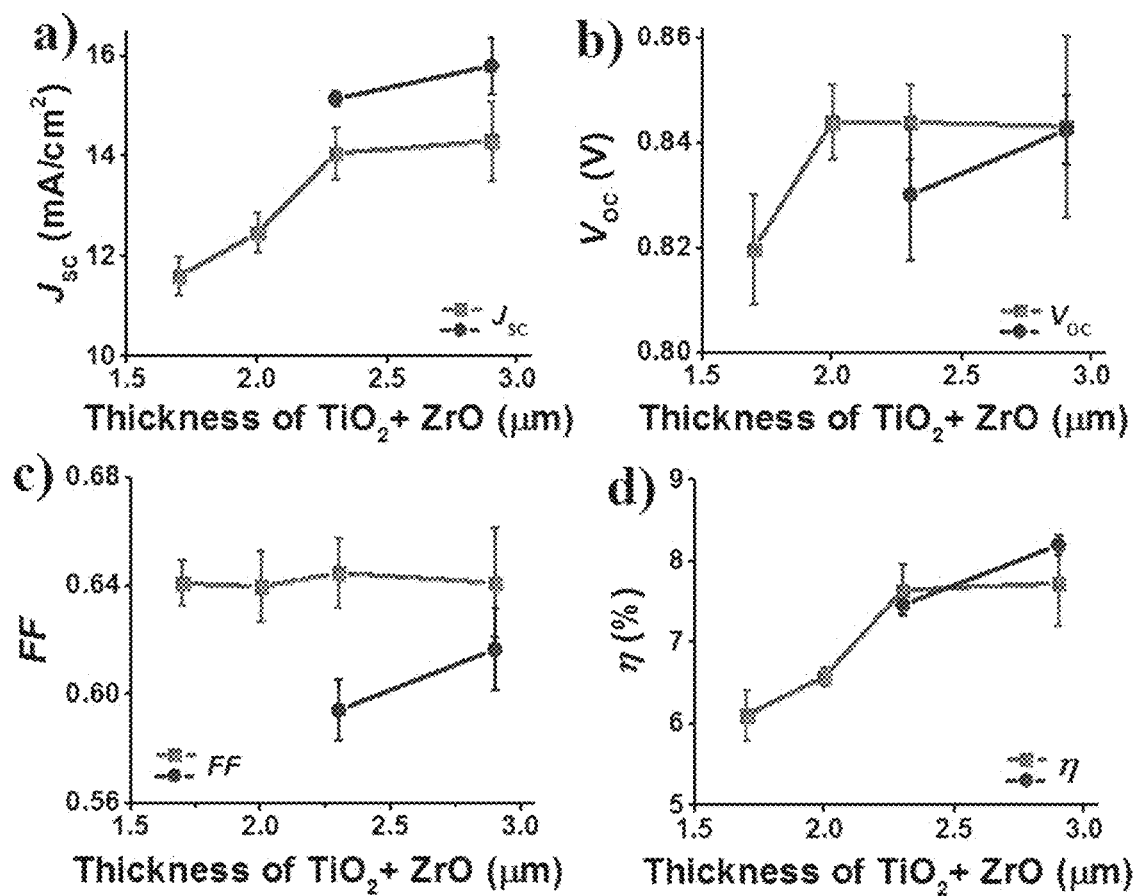
FIG. 4 shows average photovoltaic performance and their standard deviation of a first batch (Batch 1) of 18 perovskite solar cells produced in accordance with an embodiment of the invention (in red squares). These cells were infiltrated with 3.18 µl of perovskite precursor ink. The blue circles represent the photovoltaic performance of second batch (Batch 2) of 7 cells produced in accordance with another embodiment of the invention, with 3.71 µl of perovskite precursor ink. The active area of the solar cell was 0.16 $cm^2$ which was defined by black tape mask.
Figure 5:
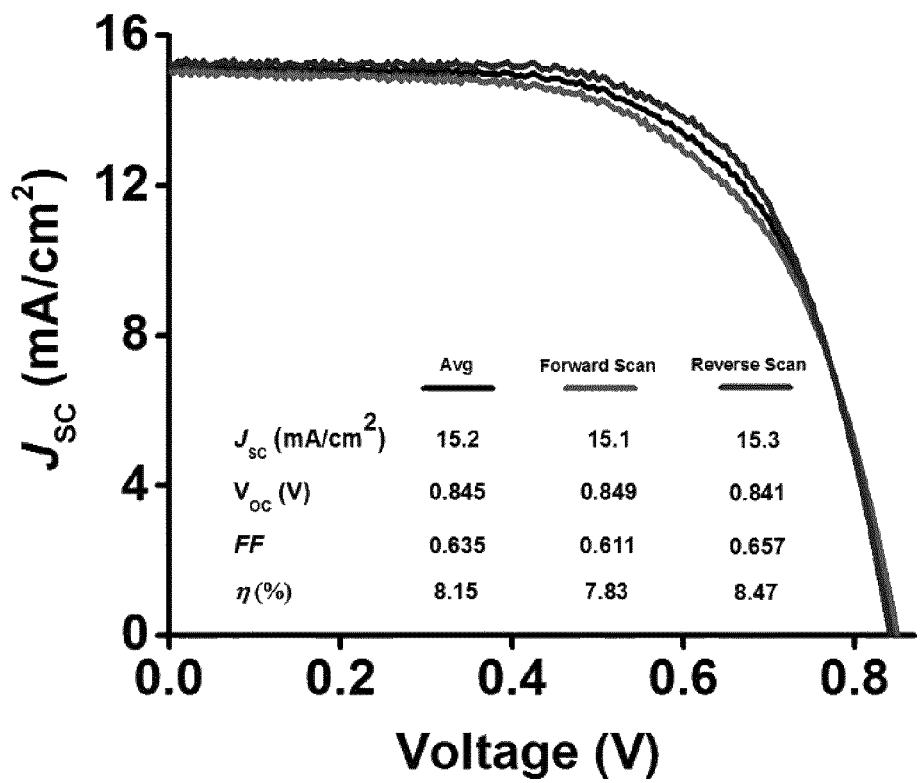
FIG. 5 shows the J-V curve of a perovskite solar cell fabricated with inkjet infiltration of perovskite precursor ink in accordance with an embodiment of the invention. The active area of the cell was 0.16 $cm^2$ which was defined by the aperture area of the black tape mask.

Hence encouraged from these preliminary trials, 10×10 cm FTO-Glass substrates having 18 individual cells of HTM free triple layer PSCs (FIG. 3, left photo) were fabricated according to the earlier proposed scheme (FIG. 1 a-g) and were finally inkjet-infiltrated from top of carbon electrode and were measured in the solar simulator to analyze the photovoltaic performance (FIG. 3, right photo). The average photovoltaic performance along with their standard deviations of cells of the first batch (Batch 1) (in red) is depicted in FIG. 4 a-d. The thickness of $ZrO_2$ in these PSCs was systematically varied by increasing number of prints (1-4 layers of $ZrO_2$). After that the combined thickness of mesoporous $TiO_2$ and $ZrO_2$ was measured with profilometer (1.7-2.9 µm). Additionally, the volume of perovskite precursor ink for this batch was first adjusted to 3.18 µl which saturated the triple layer ($TiO_2$/$ZrO_2$/C) stack of PSCs in which the overall thickness of $TiO_2$+$ZrO_2$ was 2.3 µm. Nevertheless the volume of fluid was not found enough to saturate slightly thicker stack in which the overall $TiO_2$+$ZrO_2$ thickness was 2.9 µm. This exhibited almost equal performance of PSCs (containing 2.3 µm thick $TiO_2$+$ZrO_2$ layers) in terms of short circuit current density (~$J_{SC}$=14.1±0.5 mA/cm$^2$) and efficiency (η=7.65±0.3%) when compared with the PSCs fabricated with slightly thicker (2.9 µm) combined stack of $TiO_2$ and $ZrO_2$ (i.e. $J_{SC}$=14.3±0.8 mA/cm$^2$ and η=7.73±0.5%). Hence the volume of perovskite precursor ink was further adjusted to 3.71 µl which resulted significant boost of 10% and 6% in $J_{SC}$ and η respectively (FIG. 4 a-d in blue circles). The J-V curve of one of the best performing device is presented in FIG. 5 which was measured under full sun illumination of a solar simulator in both the forward and reverse scanning modes. We emphasize that the automated and precise inkjet infiltration of perovskite precursor remarkably improved the performance reproducibility among the fabricated devices, hence certifying the reliable process control which has been considered as a key factor in fabrication of any device at large scale [28].

Furthermore, one more batch of PSCs (comprised of 9 cells) was subjected to the continuous full sun light illumination at 35° C. over a period of 1046 hours without any encapsulation. FIG. 6 represents the average photovoltaic performance of these 9 PSCs along with their standard deviations which revealed exceptionally high stability with almost no change in overall efficiency (6.4±0.6%) when compared with initial efficiency (6.7±0.3%). This notable performance achieved due to high stability of $J_{SC}$ values which also remained very stable till the end of ageing test (FIG. 6 a). Nevertheless, the signs of degradation in some of the devices were appeared around the edges of the carbon electrode. The yellow color could result from lead iodide forming to the edge areas of the cell. Hence we also investigated any possible change in the active area under the carbon with our established camera imaging technique (which we have demonstrated in earlier reports for monitoring the degradation in DSSCs [29-30]) as the changes were so minor that it was difficult to analyze them by the eye. The aged cells were found lighter than the fresh ones, i.e. the cell materials had transformed also at the interior of the cell during the aging even though it was not apparent by the eye or by the changes in the efficiency of the cells. For this report, we presented these results only as indicatives for this configuration of PSCs as we believe this is an interesting finding since understanding of the origin and nature of these minor changes that are not visible and significant in 1000 hour timescale, could lead to the extra long-term stability of PSC that is necessary for their wide spread commercial application. Moreover, the possible change in $CH_3NH_3PbI_3$ absorber material in fresh and aged PSCs was also analyzed through X-ray diffraction (XRD) patterns. No feature of $PbI_2$ in XRD pattern of fresh device was appeared within the detection limit. On the other hand, negligible feature in the aged devices (2θ=12.6) corresponding to $PbI_2$ phase was detected confirming slight degradation. Nevertheless, for this PSCs configuration, more improvements in device stability is expected in near future as we also aim to apply screen printable epoxy sealants or glass encapsulations to protect the device structure from air and moisture intrusion in our future work.

Figure 7:
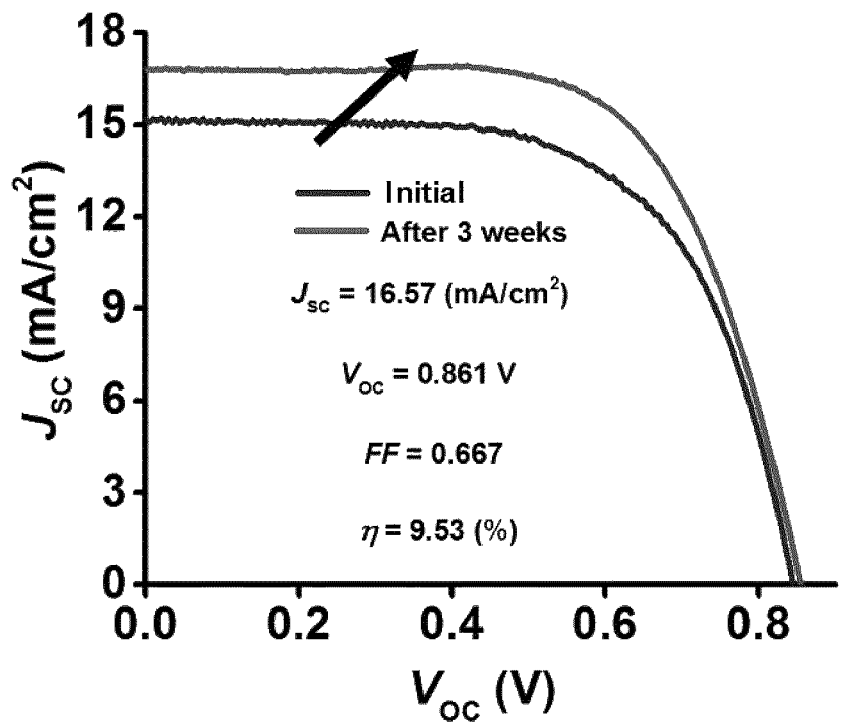
FIG. 7 shows J-V curves of a fresh perovskite solar cell (in blue) and aged (stored in vacuum for 3 weeks, in red), produced in according to embodiments of the invention.

On the other hand, remarkable enhancement in overall efficiency (~13%) was also observed from four PSCs of Batch 2 (as shown in FIG. 4 a-d with blue circles with $TiO_2$+$ZrO_2$ thickness=2.9 µm) due to an impressive improvement in $J_{SC}$ and FF after storing them in vacuum (in dark) for three weeks. The champion device upon re-measuring exhibited an improved performance with an overall conversion efficiency of 9.53% (FIG. 7) among the average efficiency (9.4±0.1%) of these four PSCs thus showing tremendous potential of their entire fabrication with non-vacuum based equipment and processes as shown in FIG. 1 (a-h).

The results shown here are very encouraging to adopt inkjet printing as a method of perovskite precursor infiltration in a highly porous structure which offers several advantages over manual infiltration in this type of PSC configuration. For instance there is no additional optimized environment required such as glove box since the precursor ink remain isolated in the cartridge tank and reduces the chances of contamination that cannot be avoided during manual infiltration where the micropipette could touch the carbon electrode and can also damage the active area due to human error. Additionally the automated inkjet infiltration allows homogenous dispensing and distribution of perovskite precursor ink on the active electrode area thus provides high probability of device performance reproducibility which cannot be realized with manual infiltration scheme. This effect was significantly evident among different batches of PSCs fabricated for this experiment where the sample to sample variations were impressively very low and even the enhancements in performance against the variance in $ZrO_2$ thickness were very systematic.

In conclusion, we successfully demonstrated here the capability and potential of inkjet infiltration of highly stable perovskite precursor ink for porous triple layered HTM free printed PSCs. The fabricated devices unveiled impressive photovoltaic performance when infiltrated with perovskite precursor through inkjet printer and showed high stability when subjected to long-term light soaking stability test. The process presented in this report provides an opportunity to fabricate this interesting configuration at large area in future. The controlled infiltration of perovskite precursor may also be useful in future to adjust the contents of Pb precisely that have been strictly regulated in many other cases due to its toxicity [31]. Since the low variability of each key process along with process-induced defects play vital role in cost efficient manufacturing of PV systems [28], all the fabrication steps (such as screen printing and inkjet infiltration) except for spray pyrolysis fulfils this requirement and makes it possible to fabricate this PSC configuration with reliable process control. One of the future motivations for this configuration will be to replace the spray pyrolysis based compact $TiO_2$ layer with a printable compact layer to produce 100% printable HTM free PSCs.

Example 2: Comparison of Stability of Inks of the Invention and Prior Art Inks

Experiment 1

Two inks were compared for demonstrating the superior stability at room temperature of the ink according to an embodiment of the invention.

Compositions of Inks

Ink 1: 1.1 g PbI$_2$, 0.38 g MAI, 0.029 g AVAI (40 wt % in GBL, γ-butyrolactone)

Ink 2: 1.1 g PbI$_2$, 0.38 g MAI (No AVAI).

Ink 2 contains equimolar concentrations of PbI$_2$ and MAI (methylammonium iodide). Ink 1 contains, in addition 5-AVAI, which is a compound of formula (I) in accordance with an embodiment of the invention.

Figure 11:
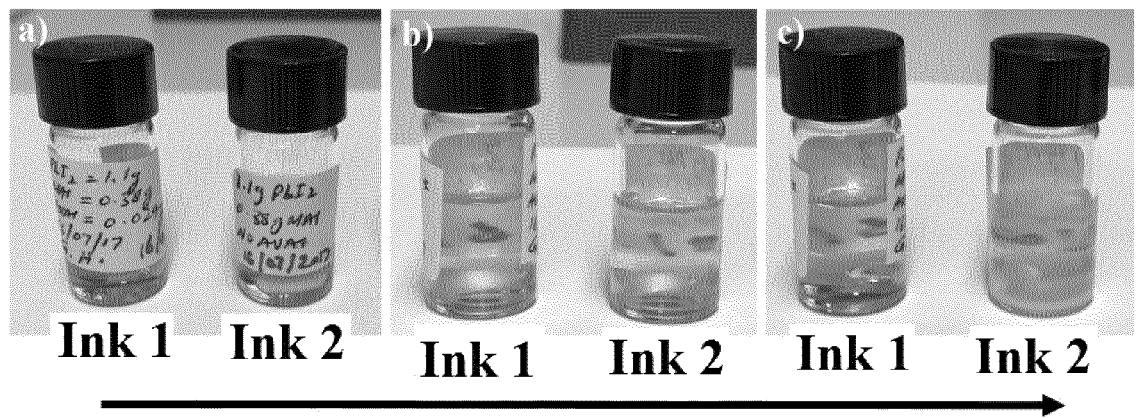
FIG. 11 shows photographs of an ink in accordance with the invention (left vial) compared to an ink with a conventional composition (right vial). Panels a)-b) show front and back views of the vials directly after preparation. Panel c) shows the ink after 20 minutes at room temperature.
Figure 12:
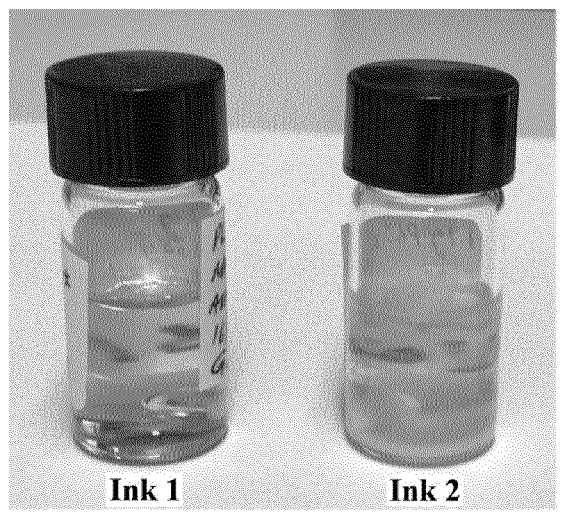
FIG. 12 is an enlarged view of panel c) of FIG. 11, showing precipitation occurring in the prior art ink.

In the photographs in FIG. 11, panels a) and b), it is apparent that both inks provide clear solutions when the inks are fresh. After storage at room temperature (25° C.) for 20 minutes, ink 2 shows clouding indicating precipitation, as shown in panel c) of FIG. 11 and in FIG. 12.

In conclusion, Ink 1 produced in accordance with an embodiment of the invention showed remarkable stability compared to Ink 2. Ink 1 is particularly suitable for inkjet infiltration, whereas ink 2 will lead to clogging of the ink nozzle at room temperature.

Experiment 2

In this experiment, an ink is prepared in accordance with the disclosure of S. Li et al., Inkjet printing of CH3NH3PbI3 on a mesoscopic TiO$_2$ film for highly efficient perovskite solar cells, J. Mater. Chem. A, 2015, 3, 9092-9097, for comparing stability with an ink according to the invention.

Ink 1: 35 wt % of (MAI, PbI$_2$ and MACl) with a Molar Ratio [1−x:1:x (x=0.6)] in GBL as mentioned in the publication. This ink was shown to result in devices with high efficiency (Table 1).

Ink 2: 1.1 g PbI$_2$, 0.38 g MAI, 0.029 g AVAI (40 wt % in GBL) (as Ink 1 in Experiment 1)

Figure 13:
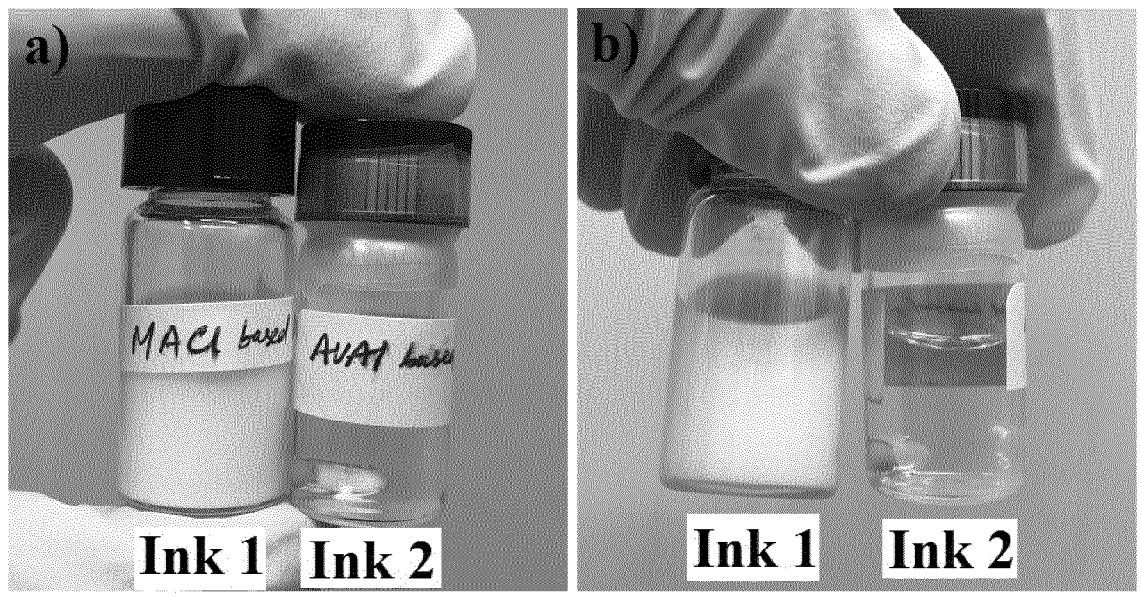
FIG. 13 shows photographs of an ink in accordance with the invention ("ink 2" right vial) compared to an ink according to the prior art ("ink 1" left vial). The prior art ink contains 35 wt % of (MAI, $PbI_2$ and MACl) with a Molar Ratio [1−x:1:x (x=0.6)] in γ-butyrolactone. The components of this ink did not dissolve and the ink seems to be saturated.

FIG. 13 shows the inks immediately after preparation at RT. Ink 1, prepared in accordance with S. Li et al. 2015, was not able to dissolve in contrast to the ink according to the invention. The publication of S. Li et al. 2015 seems to be incomplete and lacks reproducibility, in as far as the publication does not disclose how the solutes were dissolved in order to prepare the ink. Problems most likely occurring during printing, such as clogging of the printing nozzles are not disclosed in this reference. The inkjet printer used in S. Li et al. 2015 comprises a heater. The reference does not disclose the temperature of the ink in the cartridge. The present experiments shows that in order to print Ink 1 by inkjet printing, the ink needs probably to be heated, in order to avoid precipitation even in the cartridge.

Figure 14:
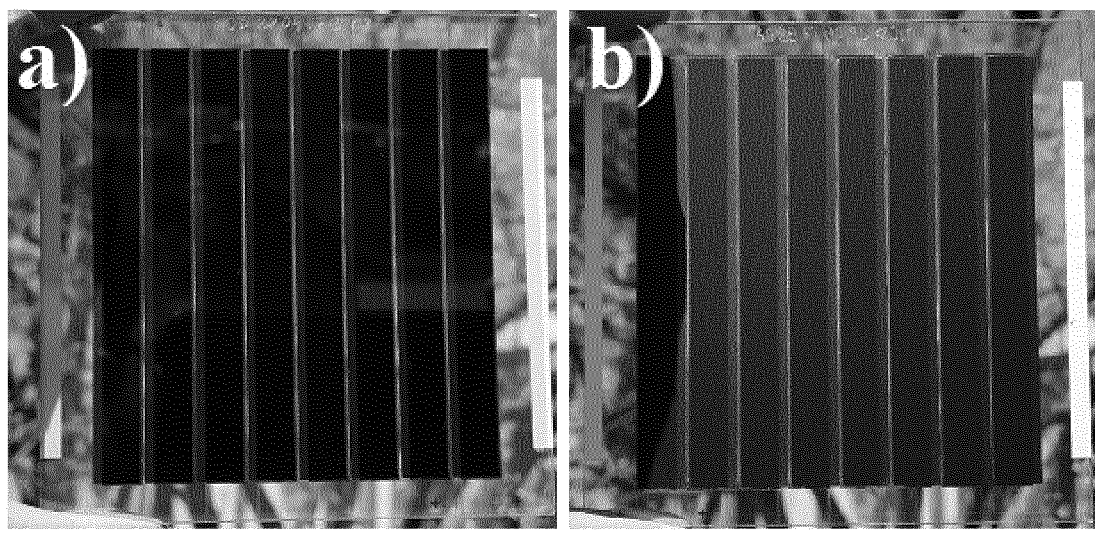
FIG. 14 shows photographs of the front and rear sides, panel a) and panel b), respectively, of solar cell modules having a size of 10×10 cm. The cells comprise organic inorganic perovskite layers deposited by inkjet printing in accordance with the invention.

Example 3: Depositing Perovskite on Large Surfaces for Obtaining Large Area Solar Modules Based on the architecture disclosed in Example 1 above, solar cell modules of the size of 10 cm×10 cm were prepared. The perovskite was deposited by ink jet printing as disclosed above. FIG. 14 shows photographs of the front side (panel a), and the back side (panel b) of the solar cells. For an area of carbon (67.15 cm$^2$ or 68 cm$^2$), 134 µl of perovskite ink was infiltrated. The solar cell module shown has a conversion efficiency of 6.08%, a fill factor (ff) of 60.4%, JSC and VOC values of 1.435 mA/cm$^2$ and 7.02 V, respectively for an active area of 47.6 cm2.

REFERENCES

[1] Best Research Cell-Efficiencies, National Renewable Energy Laboratory (NREL), Apr. 20, 2016, http://www.nrel.gov/ncpv/images/efficiency_chart.jpg

[2] M. A. Green, A. Ho-Baillie, H. J. Snaith, The emergence of perovskite solar cells, Nat. Photonics 2014, 8, 506-514.

[3] G. Hashmi, K. Miettunen, T. Peltola, J. Halme, I. Asghar, K. Aitola, M. Toivola, P. Lund, Ren. Sust. Energy Rev., 2011, 15, 3717-3732.

[4] H. Zhou, Q. Chen, G. Li, S. Luo, T.-B. Song, H.-S. Duan, Z. Hong, J. You, Y. Liu, Y. Yang, Interface engineering of highly efficient perovskite solar cells, Science, 2014, 345, 542.

[5] T. M. Schmidt, T. T. Larsen-Olsen, J. E. Carlé, Dechan Angm, Frederik C. Krebs, Upscaling of Perovskite Solar Cells: Fully Ambient Roll Processing of Flexible Perovskite Solar Cells with Printed Back Electrodes, Adv. Energy Mater. 2015, 5, 15005649.

[6] Boix, P. P., K. Nonomura, N. Mathews, and S. G. Mhaisalkar. 2014. "Current progress and future perspectives for organic/inorganic perovskite solar cells." Materials Today no. 17 (1):16-23.

[7] Burschka, J. et al. Sequential deposition as a route to high-performance perovskite-sensitized solar cells. Nature 499, 316-319 (2013).

[8] M. Liu, M. B. Johnston, H. J. Snaith, Efficient planar heterojunction perovskite solar cells by vapour deposition, Nature, 2013, 501, 395-398.

[9] T. Leijtens, G. E. Eperon, S. Pathak, A. Abate, M. M. Lee, and H. J. Snaith, Overcoming ultraviolet light instability of sensitized TiO$_2$ with meso-superstructured organometal tri-halide perovskite solar cells," Nat. Commun. 4, 2885 (2013).

[10] S. Guarnera, A. Abate, W. Zhang, J. M. Foster, G. Richardson, A. Petrozza, H. J. Snaith, Improving the long-term stability of perovskite solar cells with a Porous Al$_2$O$_3$ Buffer Layer, J. Phys. Chem. Lett., 2015, 6 (3), 432-437.

[11] S. Guarnera, A. Abate, W. Zhang, J. M. Foster, G. Richardson, A. Petrozza, H. J. Snaith, Improving the Long-Term Stability of Perovskite Solar Cells with a Porous Al$_2$O$_3$ Buffer Layer, J. Phys. Chem. Lett. 2015, 6, 432-437.

[12] A. Mei, X. Li, L. Liu, Z. Ku, T. Liu, Y. Rong, M. Xu, M. Hu, J. Chen, Y. Yang, M. Grätzel, H. Han, A hole-conductor-free, fully printable mesoscopic perovskite solar cell with high stability, Science, 2014, 345, 295-298.

[13] Y. Bai, H. Yu, Z. Zhu, K. Jiang, T. Zhang, N. Zhao, S. Yang, H. Yan, High performance inverted structure perovskite solar cells based on a PCBM: polystyrene blend electron transport layer, J. Mater. Chem. A, 2015, 3, 9098-9102.

[14] J. You, L. Meng, T. Bin. Song, T. F. Guo, Y. M. Yang, W. H. Chang, Z. Hong, H. Chen, H. Zhou, Q. Chen, Y. Liu, N. D. Marco, Y. Yang, Improved air stability of perovskite solar cells via solution-processed metal oxide transport layers, Nature Nanotechnology, 2016, 11, 75-81.

[15] J. H. Heo, H. J. Han, D. Kim, T. K. Ahn, S. H. Im, Hysteresis-less inverted CH$_3$NH$_3$PbI$_3$ planar perovskite hybrid solar cells with 18.1% power conversion efficiency, Energy Environ. Sci., 2015,8, 1602-1608.

[16] Q. Tai, P. You, H. Sang, Z. Liu, C. Hu, H. L. W. Chan, F. Yan, Efficient and stable perovskite solar cells prepared in ambient air irrespective of the humidity, Nature Communications 7, Article number: 11105, 2016 (1-8).

[17] W. Nie, J. C. Blancon, A. J. Neukirch, K. Appavoo, H. Tsai, M. Chhowalla, M. A. Alam, M. Y. Sfeir, C. Katan, J. Even, S. Tretiak, J. J. Crochet, G. Gupta, A. D. Mohite, Light-activated photocurrent degradation and self-healing in perovskite solar cells, Nature Communications |7:11574|2016.

[18] A. Mei, Xiong Li, L. Liu, Z. Ku, T. Liu, Ya. Rong, M. Xu, Min Hu, J. Chen, Y. Yang, M. Grätzel, H. Han, A hole-conductor-free, fully printable mesoscopic perovskite solar cell with high stability, Science, 345, 2014, 295-298.

[19] L. Liu, A. Mei, T. Liu, P. Jiang, Y. Sheng, L. Zhang, H. Han, Fully Printable Mesoscopic Perovskite Solar Cells with Organic Silane Self-Assembled Monolayer, J. Am. Chem. Soc., 2015, 137 (5), pp 1790-1793.

[20] J. Chen, Y. Rong, A. Mei, Y. Xiong, T. Liu, Y. Sheng, P. Jiang, L. Hong, Y. Guan, X. Zhu, X. Hou, M. Duan, J. Zhao, X. Li, H. Han, Hole-Conductor-Free Fully Printable Mesoscopic Solar Cell with Mixed-Anion Perovskite $CH_3NH_3PbI_{(3-x)}(BF4)_x$, Adv. Energy Mater. 2015, 1502009 1-6.

[21] Z. Ku, Ya. Rong, M. Xu, T. Liu, H. Han, Full Printable Processed Mesoscopic $CH_3NH_3PbI_3/TiO_2$ Heterojunction Solar Cells with Carbon Counter Electrode, Scientific Reports 3, Article number: 3132.

[22] X. Li, M. Tschumi, H. Han, S. S. Babkair, R. Ali Alzubaydi, A. A. Ansari, S. S. Habib, M. K. Nazeeruddin, S. M. Zakeeruddin, M. Grätzel, Outdoor Performance and Stability under Elevated Temperatures and Long-Term Light Soaking of Triple-Layer Mesoporous Perovskite Photovoltaics, Energy Technol 2015 3, 551-555.

[23] S. G. Hashmi, M. Ozkan, J. Halme, K. Dimic-Misic, S. M. Zakeeruddin, J. Paltakari, M. Grätzel, P. D. Lund, High performance dye-sensitized solar cells with inkjet-printed ionic liquid electrolyte, Nano Energy (2015) 17, 206-215.

[24] S. G. Hashmi, M. Ozkan, J. Halme, S. M. Zakeeruddin, J. Paltakari, M. Grätzel, P. D. Lund, Dye-sensitized solar cells with inkjet-printed dyes (Accepted article in Energy and Environmental Science 2016, DOI: 10.1039/C6EE00826G).

[25] S. G. Li, K. J. Jiang, M. J. Su, X. P. Cui, J. H. Huang, Q. Q. Zhang, X. Q. Zhou, L. M. Yang, Y. L. Song, Inkjet printing of $CH_3NH_3PbI_3$ on a mesoscopic $TiO_2$ film for highly efficient perovskite solar cells, J. Mater. Chem. A, 2015,3, 9092-9097.

[26] M. Bag, Z. Jiang, L. A. Renna, S. P. Jeong, V. M. Rotello, D. Venkataraman, Rapid combinatorial screening of inkjet-printed alkyl-ammonium cations in perovskite solar cells, Materials Letters 164 (2016) 472-475.

[27] Z. Wei, H. Chen, K. Yan, S. Yang, Inkjet Printing and Instant Chemical Transformation of a $CH_3NH_3PbI_3$/Nanocarbon Electrode and Interface for Planar Perovskite Solar Cells, Angew. chem, 2014, 126, 13455-13459.

[28] A. A. Asif, R. Singh, G. F. Alapatt, Technical and economic assessment of perovskite solar cells for large scale manufacturing, J. Renewable and Sustainable Energy, 7, 043120 1-12 (2015).

[29] A. Tiihonen, K. Miettunen, R. D. Mavrynsky, J. Halme, R. Leino, P. Lund, Journal of The Electrochemical Society, 162 (9) H661-H670 (2015).

[30] M. I. Asghar, K. Miettunen, S. Mastroianni, J. Halme, H. Vahlman, P. Lund, In situ image processing method to investigate performance and stability of dye solar cells, Solar Energy 86 (2012) 331-338.

[31] http://www2.epa.gov/lead/lead-laws-and-regulations (retrieved on Nov. 6, 2016). USA Environmental Protection Agency Lead Laws and Regulations.

The invention claimed is:

1. A method for depositing an organic-inorganic perovskite, the method comprising the step of depositing a perovskite precursor solution, wherein said precursor solution is deposited through a printing nozzle by inkjet printing, wherein said perovskite precursor solution comprises all components required to form said organic-inorganic perovskite, wherein said perovskite precursor solution comprises:

a first organic cation, said first organic cation being of formula (I):

wherein,

Anc is selected from —COOH, —CONH$_2$, —PO$_3$H$_2$, —PO$_2$H$_2$R$^2$, —PO$_4$H$_2$, —SO$_3$H$_2$, —CONHOH, salts thereof, and deprotonated forms thereof, R$^2$ is an organic substituent comprising from 1-20 carbon atoms and 0-10 heteroatoms, W is a positively charged moiety comprising a positively charged nitrogen atom;

R$^1$ is an optionally substituted organic moiety comprising 1-20 carbons and 0-10 heteroatoms, wherein R$^1$ and R$_2$ may be, independently, totally or partially halogenated a second organic cation, wherein said second organic cation is comprised in said organic-inorganic perovskite and wherein said first organic cation is preferably associated with or comprised in said organic-inorganic perovskite; and an inorganic metal cation and anions required for forming said organic-inorganic perovskite.

2. The method of claim 1, wherein said positively charged nitrogen atom is selected from the group consisting of: —NH$_3^+$, —NH—C(NH$_3^+$)=NH, and —N=CH—NH$_3^+$.

3. The method of claim 1, wherein R$^2$ is —(CH$_2$)—$_n$, with n being an integer of 1-10.

4. The method of claim 1, wherein said first organic cations comprise a cation selected from the cations of formulae (1)-(3):

and salts of said cations (1)-(3), wherein n is an integer of 1-10.

5. The method of claim 1, wherein said first organic cation is added to or present in said precursor solution in the form of a salt comprising at least one anion selected from the group consisting of: halide anions, CN$^-$, NCO$^-$, NCS$^-$, BF$_4^-$, and NCSe$^-$.

6. The method of claim 1, wherein said organic-inorganic perovskite to be deposited is a mixed organic cation perovskite.

7. The method of claim 1, wherein said perovskite precursor solution is stable when stored for 1 day at room temperature (25° C.) or more in a glass vial or printer cartridge, wherein stable refers to the absence of precipitation of solutes during said 1 day.

8. The method of claim 1, wherein said perovskite precursor solution has one or more of the properties selected from the group consisting of:
- a density $\delta(kg/m^3)$ of >800;
- a surface tension $\gamma(dyne/cm)$ of 15-55; and
- a solvent boiling point (° C.) of >80° C.

9. The method of claim 1, wherein during depositing by printing, the temperature of said precursor solution is controlled to be in the range of 15-50° C.

10. The method of claim 1, wherein during depositing by printing, the precursor solution is deposited with one or more selected from the group consisting of:
- a drop spacing in the range of 1-50 μm;
- by applying a customized waveform with 1-30 V amplitude and 0.1-50 kHz frequency.

11. The method of claim 1, wherein said precursor solution is deposited in the form of droplets having a volume of 0.5-20 picolitres.

12. The method of claim 1, wherein said precursor solution is deposited by drop-on-demand (DOD) inkjet printing and wherein said precursor solution is deposited by forcing the solution through a nozzle having an opening diameter of 10-100 μm.

13. A method for producing a solar cell comprising a light harvester that is an organic-inorganic perovskite, wherein said method comprises the step of depositing said perovskite precursor solution in accordance with claim 1.

14. The method of claim 1, which comprises printing said organic-inorganic perovskite layer on a surface of 90 cm² or larger in a continuous deposition process, where said printing nozzle operates continuously for covering the said surface.

15. The method of claim 14, which comprises printing said organic-inorganic perovskite layer on a surface of 200 cm² or larger in said continuous deposition process.

16. A method for producing an inkjet printable ink solution, the method comprising providing an ink solution comprising a cation of formula (I):

Anc-$R^1$—$W^+$ (I), wherein,
Anc is selected from —COOH, —$CONH_2$, —$PO_3H_2$, —$PO_2H_2R^2$, —$PO_4H_2$, —$SO_3H_2$, —CONHOH, salts thereof, and deprotonated forms thereof, $R^2$ is an organic substituent comprising from 1-20 carbon atoms and 0-10 heteroatoms, W is a charged moiety comprising a positively charger quaternary ammonium group; selected from —$NH_3^+$, —NH—$C(NH_3^+)$=NH, —N=CH—$NH_3^+$; and, $R^1$ is an optionally substituted organic moiety comprising 1-20 carbons, wherein $R^1$ and $R^2$ may be, independently, totally or partially halogenated, and wherein said inkjet printable ink solution comprises all components required to form an organic-inorganic perovskite.

17. An inkjet ink for printing an organic-inorganic perovskite, said inkjet ink comprising a cation of formula (I):

Anc-$R^1$—$W^+$ (I), wherein,
Anc is selected from —COOH, —$CONH_2$, —$PO_3H_2$, —$PO_2H_2R^2$, —$PO_4H_2$, —$SO_3H_2$, —CONHOH, and salts thereof, and deprotonated forms thereof, $R^2$ is an organic substituent comprising from 1-20 carbon atoms and 0-10 heteroatoms, W is a charged moiety comprising a positively charged quaternary ammonium group; selected from —$NH_3^+$, —NH—$C(NH_3^+)$=NH, —N=CH—$NH_3^+$; and, $R^1$ is an optionally substituted organic moiety comprising 1-20 carbons, wherein $R^1$ and $R^2$ may be, independently, totally or partially halogenated, wherein said inkjet ink comprises all components required to form said organic-inorganic perovskite.

18. A method for reducing and/or slowing down nucleation and/or precipitation of perovskite and/or perovskite intermediates in an inkjet ink comprising an organic-inorganic perovskite precursor solution, the method comprising adding a cation of formula (I) when preparing said inkjet ink:

Anc-$R^1$—$W^+$ (I), wherein,
Anc is selected from —COOH, —$CONH_2$, —$PO_3H_2$, —$PO_2H_2R^2$, —$PO_4H_2$, —$SO_3H_2$, —CONHOH, salts thereof, and deprotonated forms thereof, $R^2$ is an organic substituent comprising from 1-20 carbon atoms and 0-10 heteroatoms, W is a positively charged moiety comprising a positively charged nitrogen atom;

$R^1$ is an optionally substituted organic moiety comprising 1-20 carbons and 0-10 heteroatoms, wherein $R^1$ and $R^2$ may be, independently, totally or partially halogenated, and wherein said method further comprises adding all components required to form an organic-inorganic perovskite layer when preparing said inkjet ink.

* * * * *